United States Patent
DeBar et al.

(10) Patent No.: US 9,272,901 B2
(45) Date of Patent: Mar. 1, 2016

(54) MEMS DEVICE WITH SEALED CAVITY AND RELEASE CHAMBER AND RELATED DOUBLE RELEASE METHOD

(71) Applicant: Newport Fab, LLC, Newport Beach, CA (US)

(72) Inventors: Michael J. DeBar, Tustin, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/508,673

(22) Filed: Oct. 7, 2014

(65) Prior Publication Data

US 2015/0158721 A1    Jun. 11, 2015

Related U.S. Application Data

(60) Provisional application No. 61/914,217, filed on Dec. 10, 2013.

(51) Int. Cl.
*B81B 7/00* (2006.01)
*B81C 1/00* (2006.01)

(52) U.S. Cl.
CPC ..... *B81C 1/00293* (2013.01); *B81B 2201/0221* (2013.01); *B81B 2201/0271* (2013.01); *B81C 2203/0145* (2013.01)

(58) Field of Classification Search
CPC ............... B81C 2203/0172; B81C 1/00293; B81C 1/00269; B81C 1/00301; B81B 7/0041; H01L 2924/1461; H01L 2224/32145; H01L 2924/16153; H01L 21/54; H01L 2224/24145
See application file for complete search history.

(56) References Cited

U.S. PATENT DOCUMENTS 8,043,897 B2 * 10/2011 Lee .................. B81B 7/0061
                                                    257/416
9,018,029 B1 * 4/2015 Bowles ................... B81B 7/02
                                                    257/417

* cited by examiner

*Primary Examiner* — Roy Potter
(74) *Attorney, Agent, or Firm* — Farjami & Farjami LLP

(57) ABSTRACT

Disclosed is a MEMS device having lower, upper and release chambers with a similar pressure and/or a similar gaseous chemistry. The MEMS device includes a top MEMS plate and a bottom MEMS plate. The MEMS device also includes a lower chamber between the bottom MEMS plate and the top MEMS plate, and an upper chamber between the top MEMS plate and a first sealing layer. The MEMS device further includes a release chamber between the top MEMS plate and a second sealing layer, the release chamber allowing gaseous content of the upper and/or the lower chambers to be released. Also disclosed is a double release method for releasing gaseous content of the upper and/or the lower chambers.

20 Claims, 20 Drawing Sheets

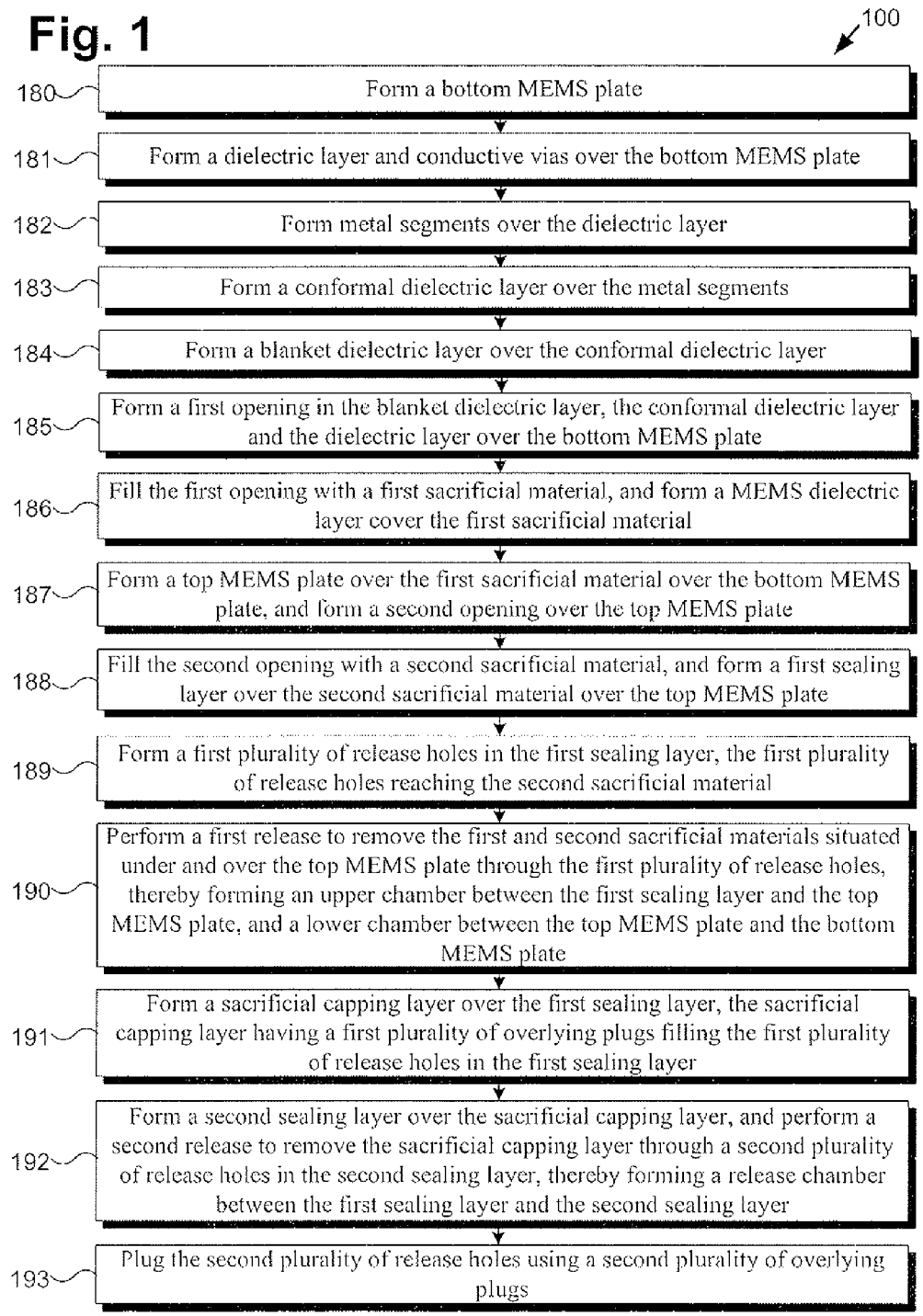

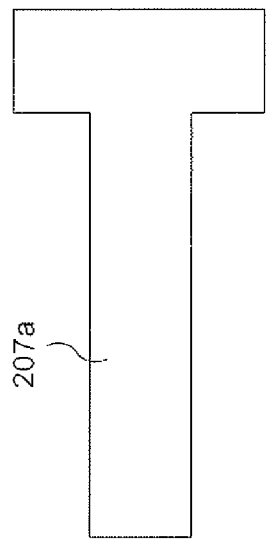
Fig. 2A-i
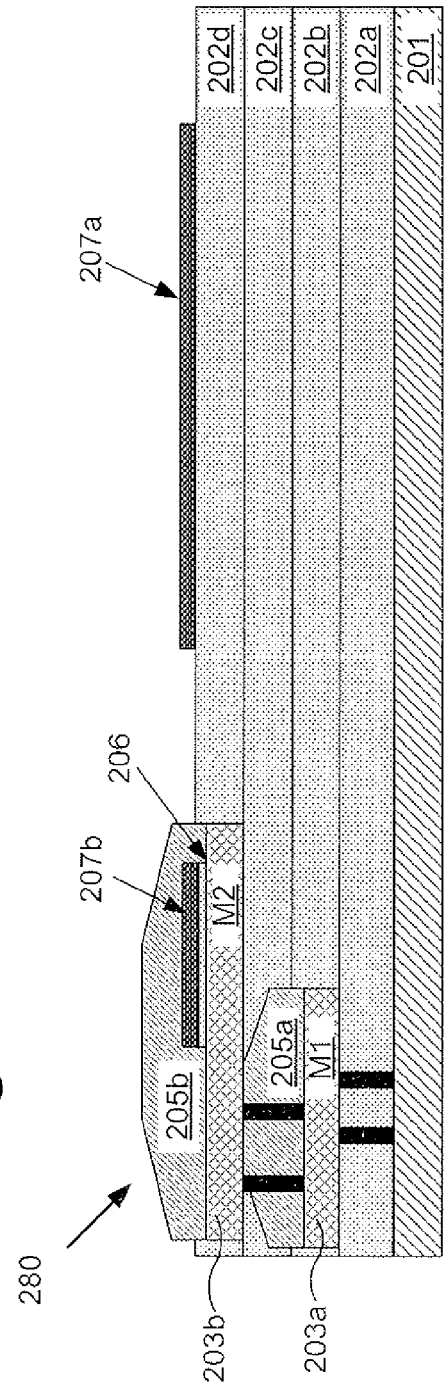
Fig. 2A-ii

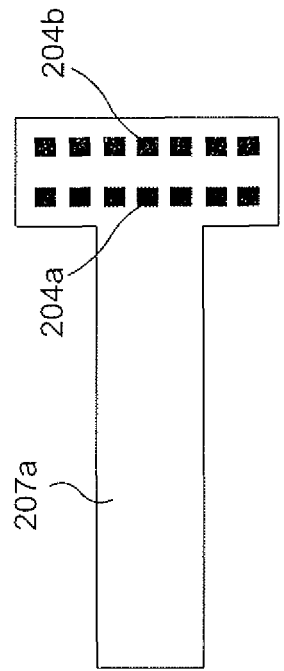
Fig. 2B-i
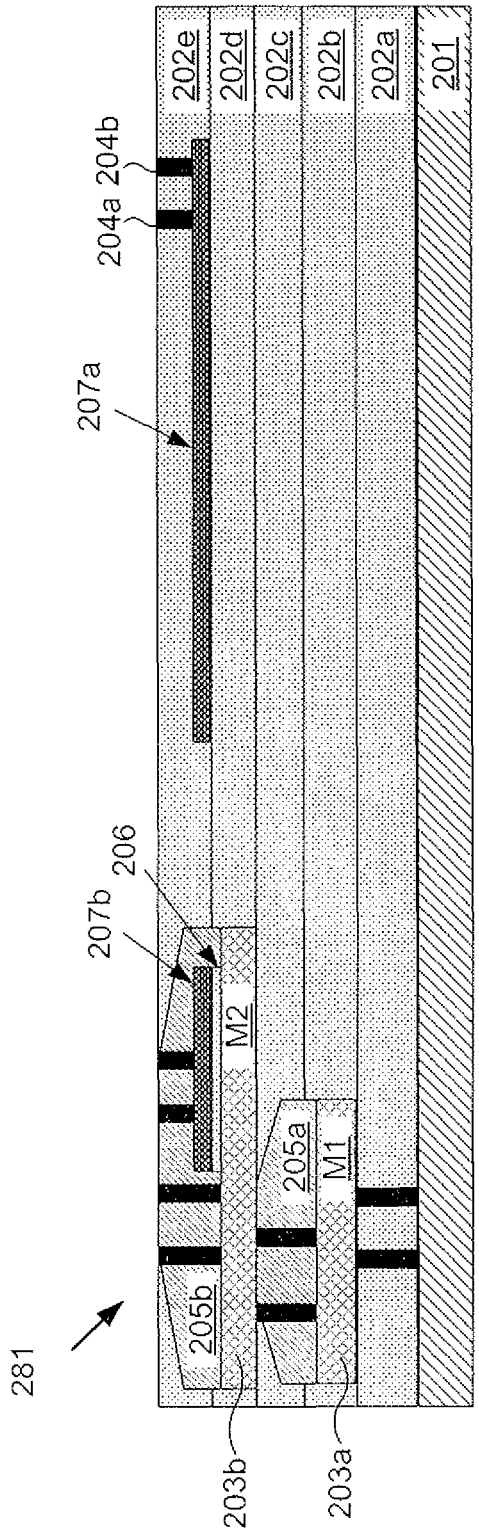
Fig. 2B-ii

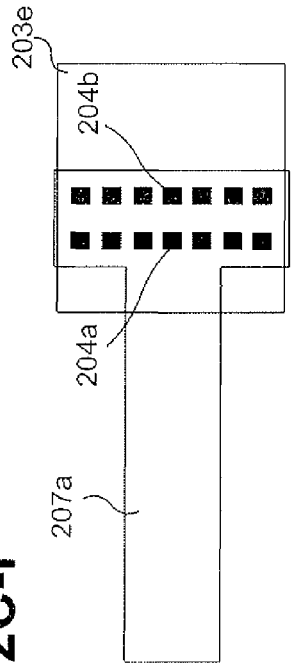
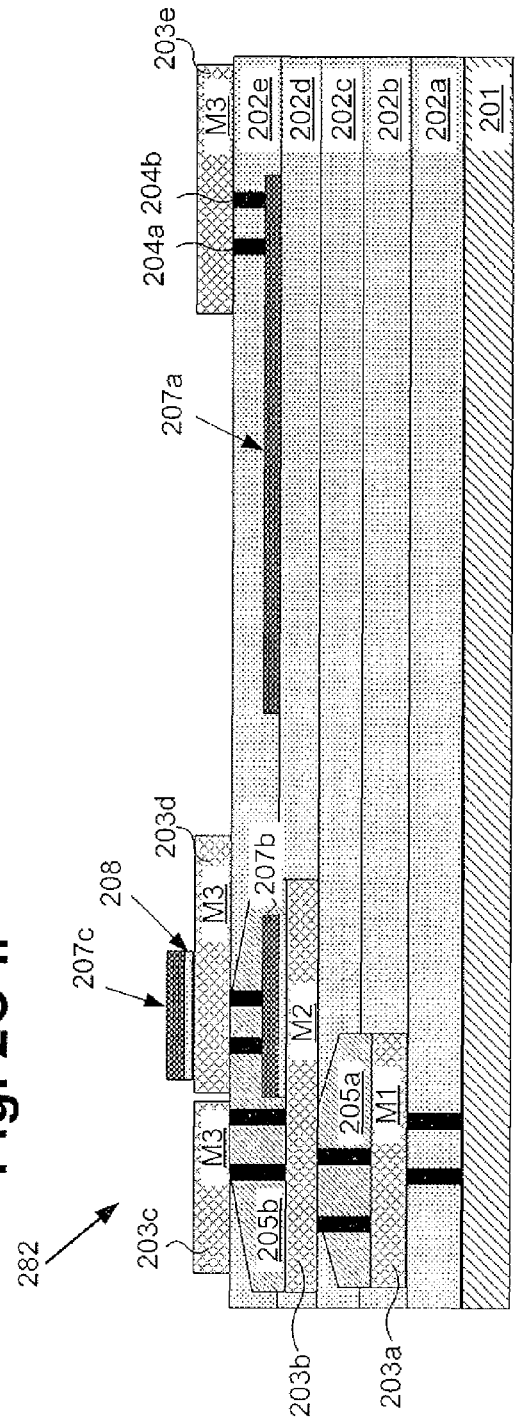
Fig. 2C-i
Fig. 2C-ii

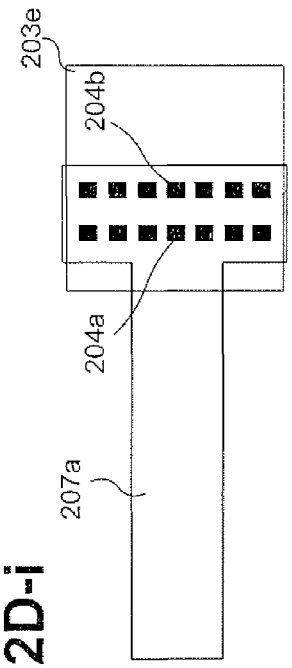
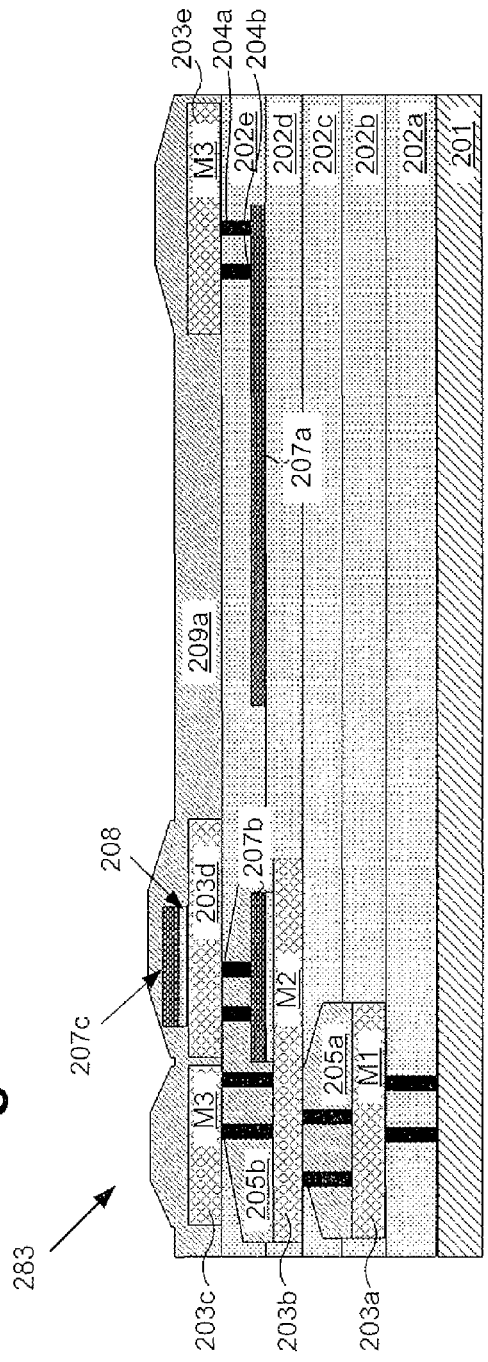
Fig. 2D-i
Fig. 2D-ii

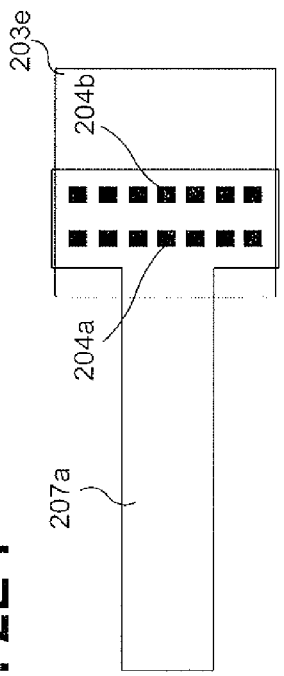
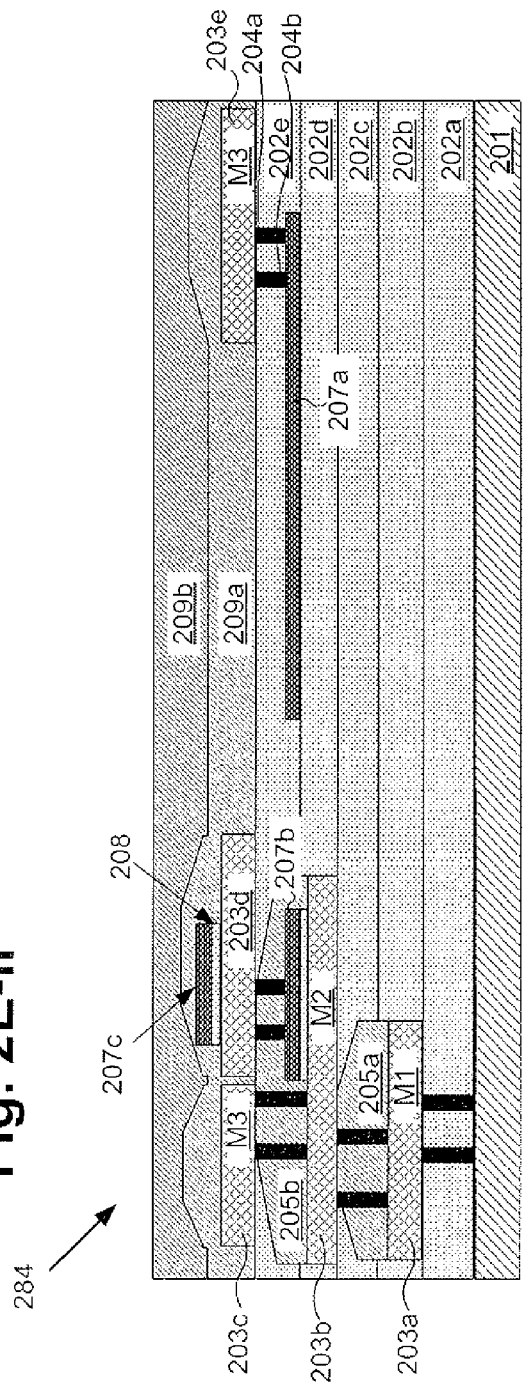
Fig. 2E-i
Fig. 2E-ii

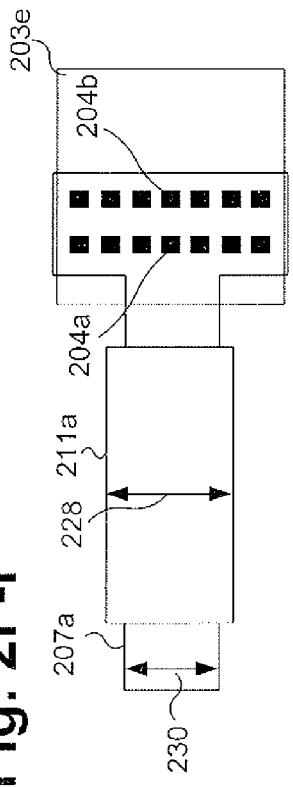
Fig. 2F-i
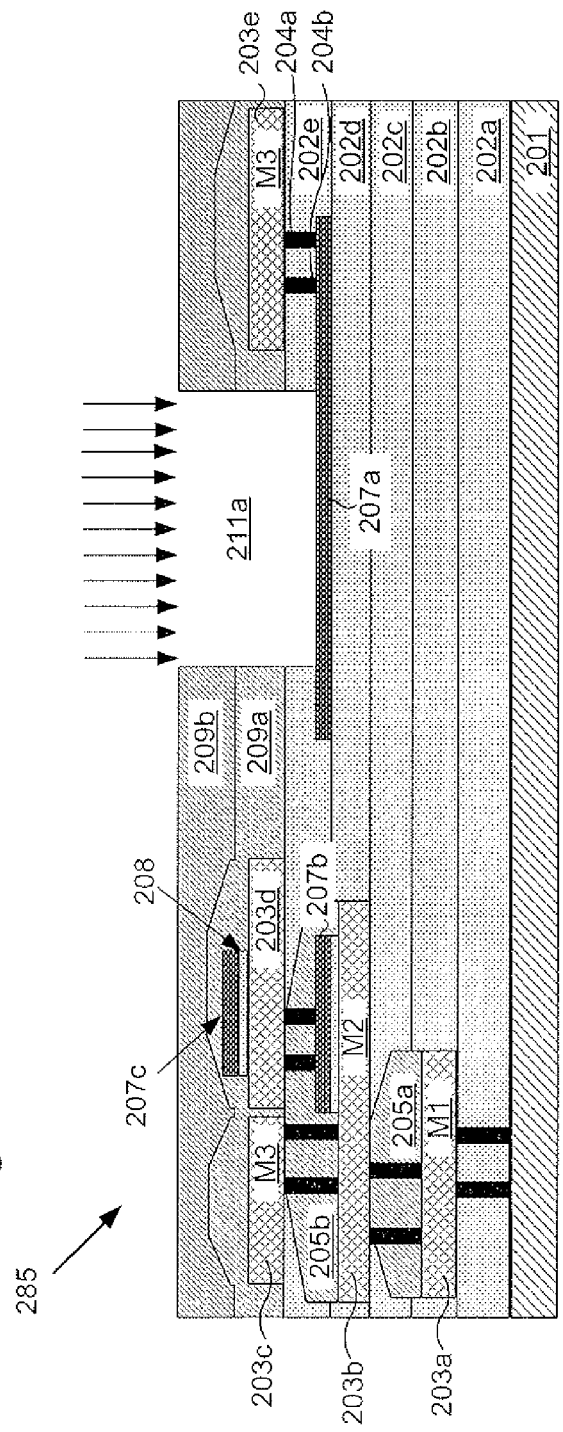
Fig. 2F-ii

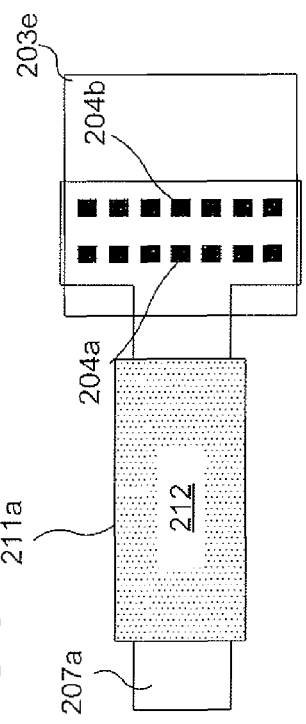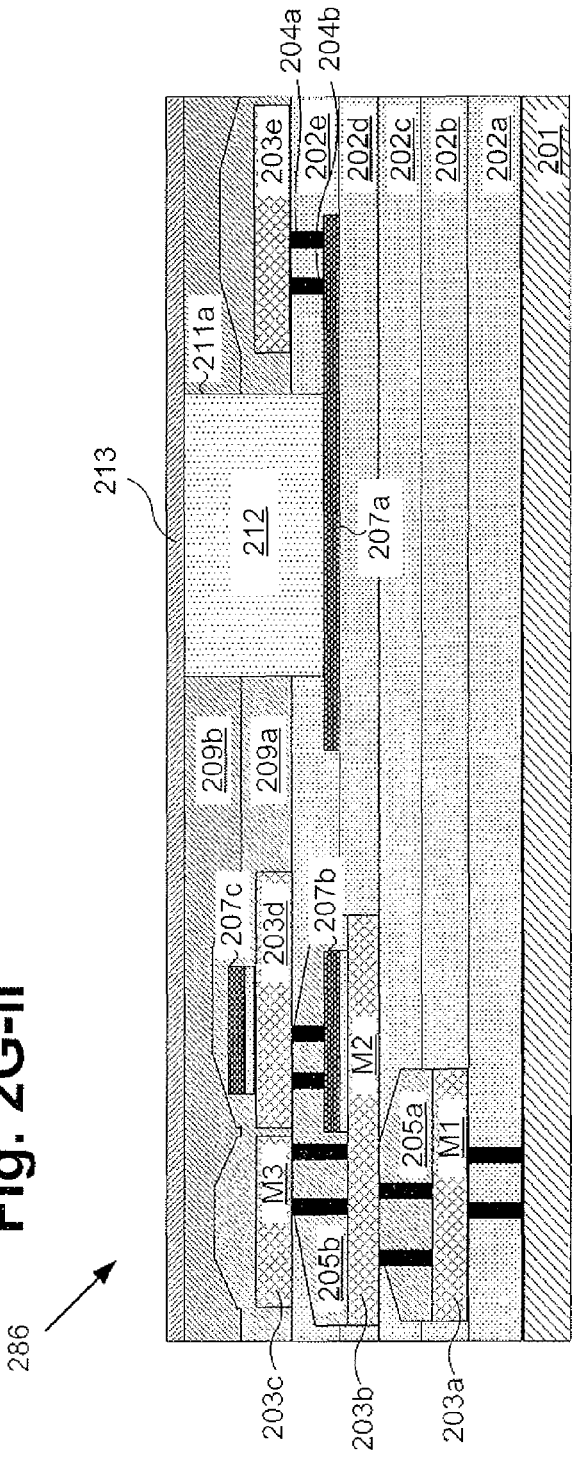

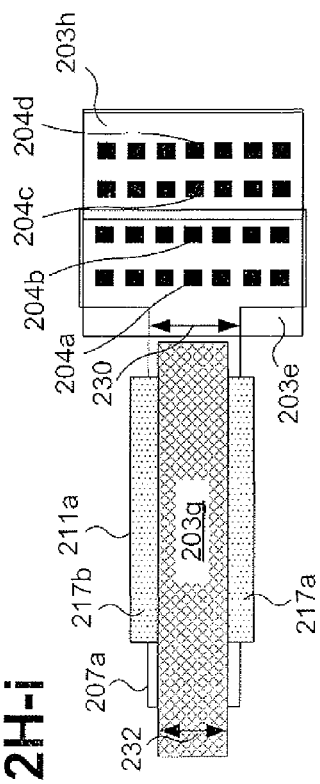
Fig. 2H-i
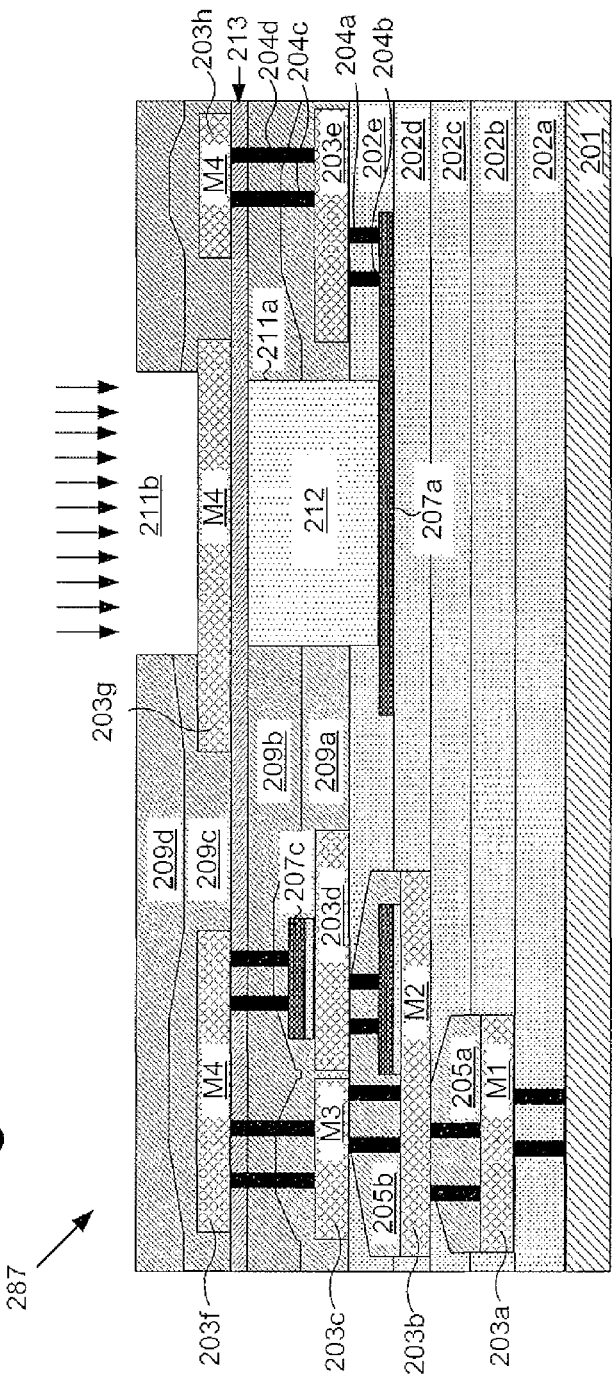
Fig. 2H-ii

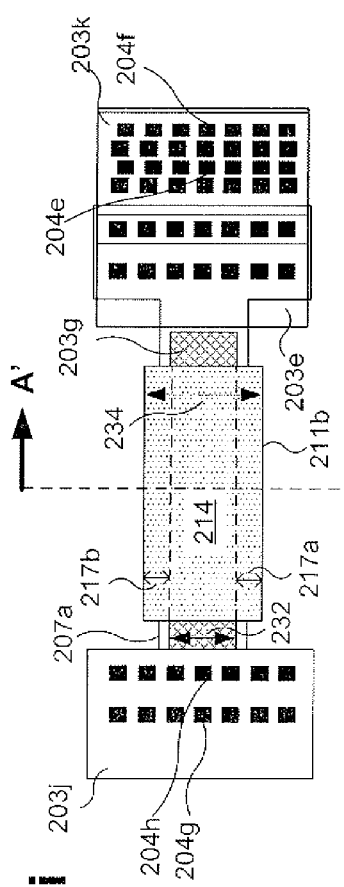
Fig. 2I-i
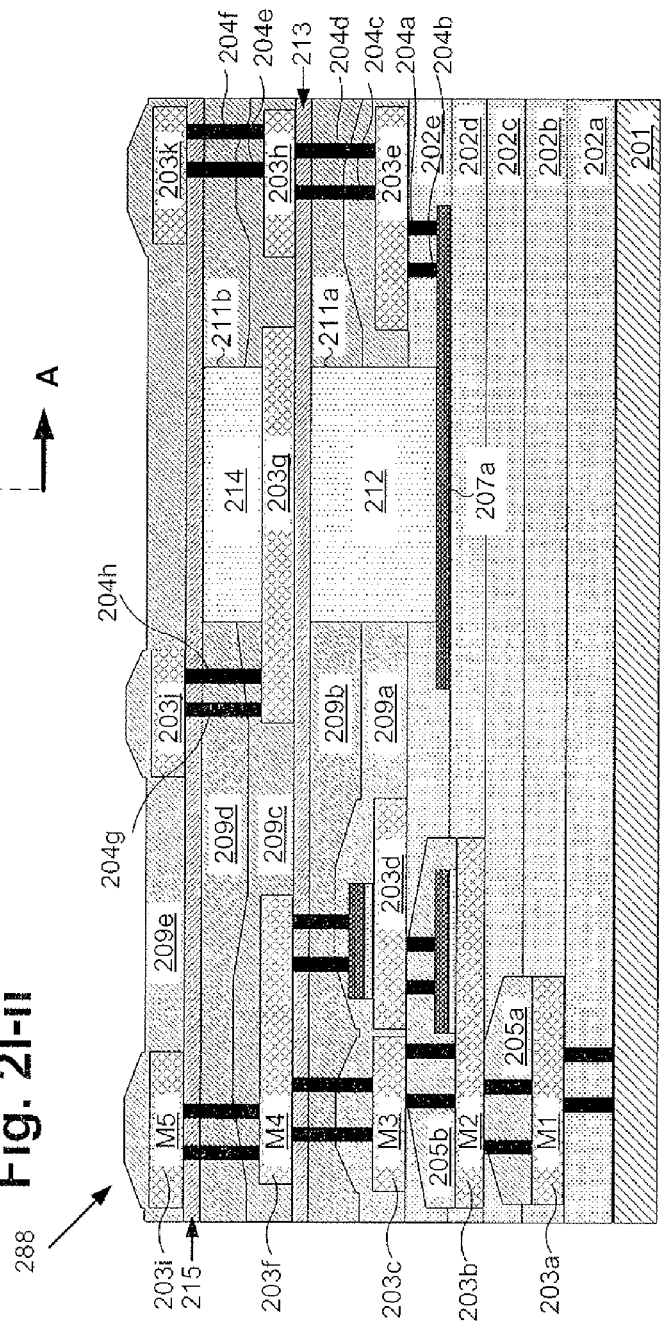
Fig. 2I-ii

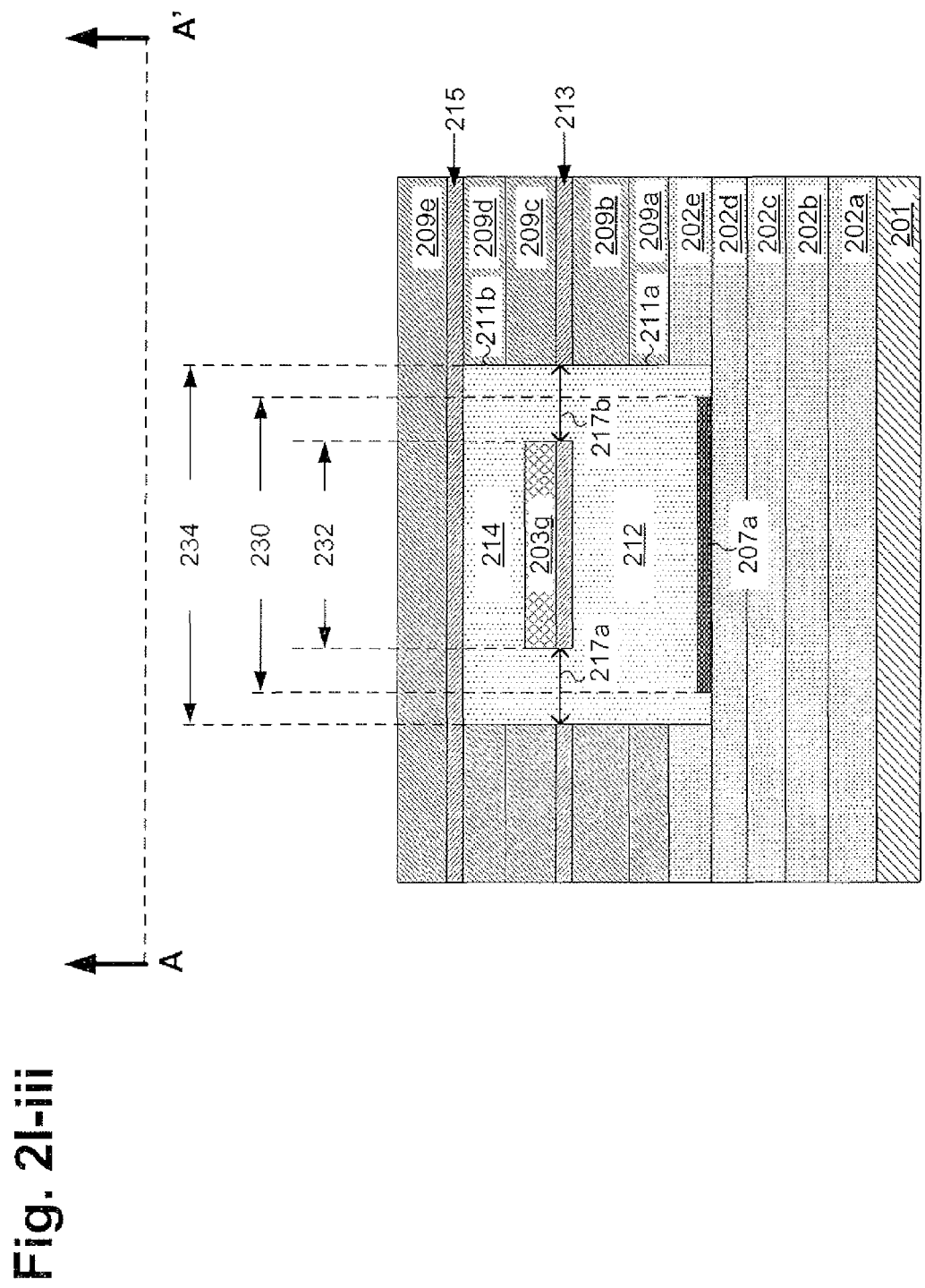
Fig. 2I-iii

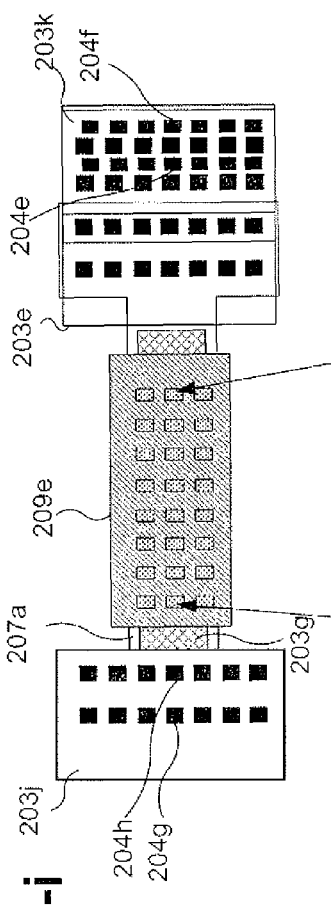
Fig. 2J-i
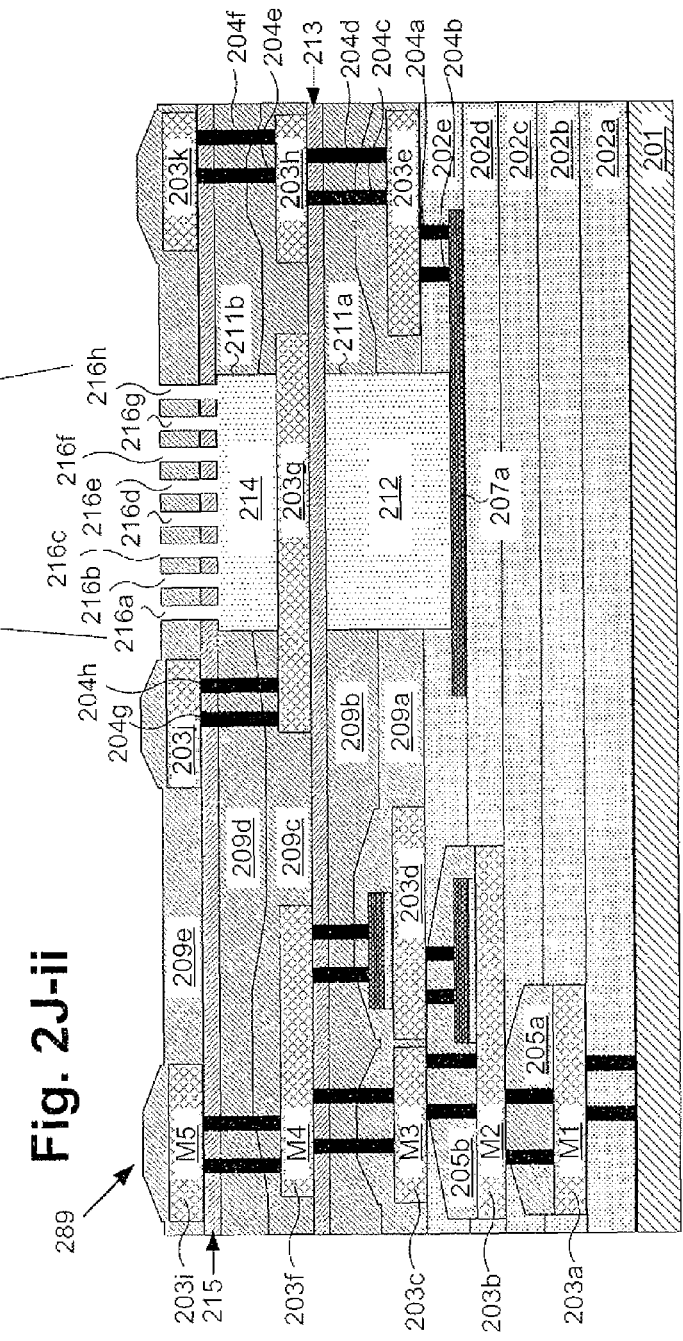
Fig. 2J-ii

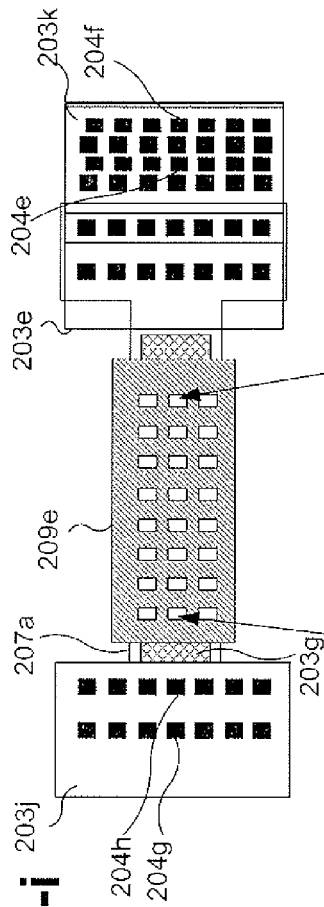
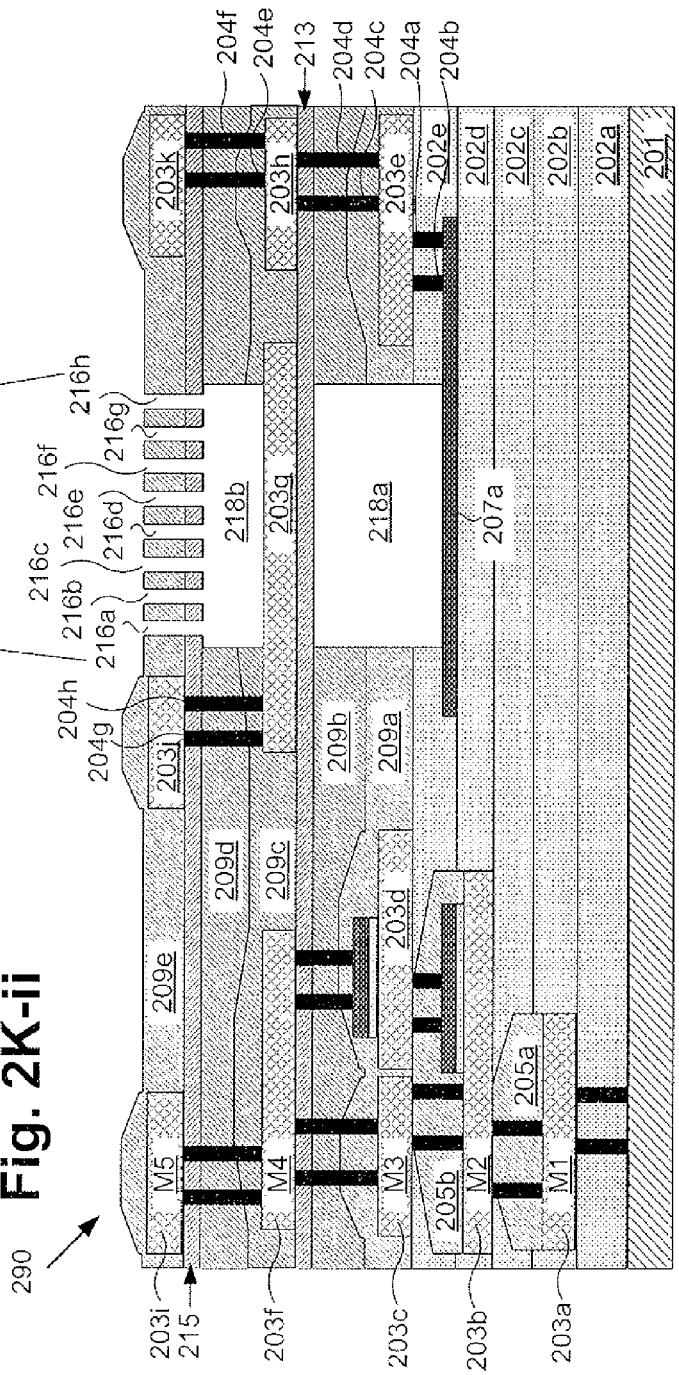
Fig. 2K-i
Fig. 2K-ii

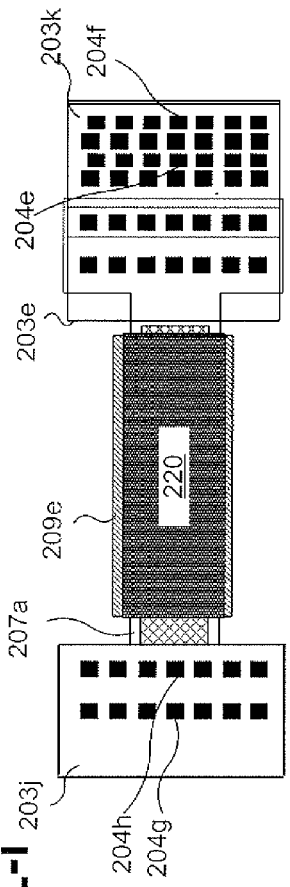
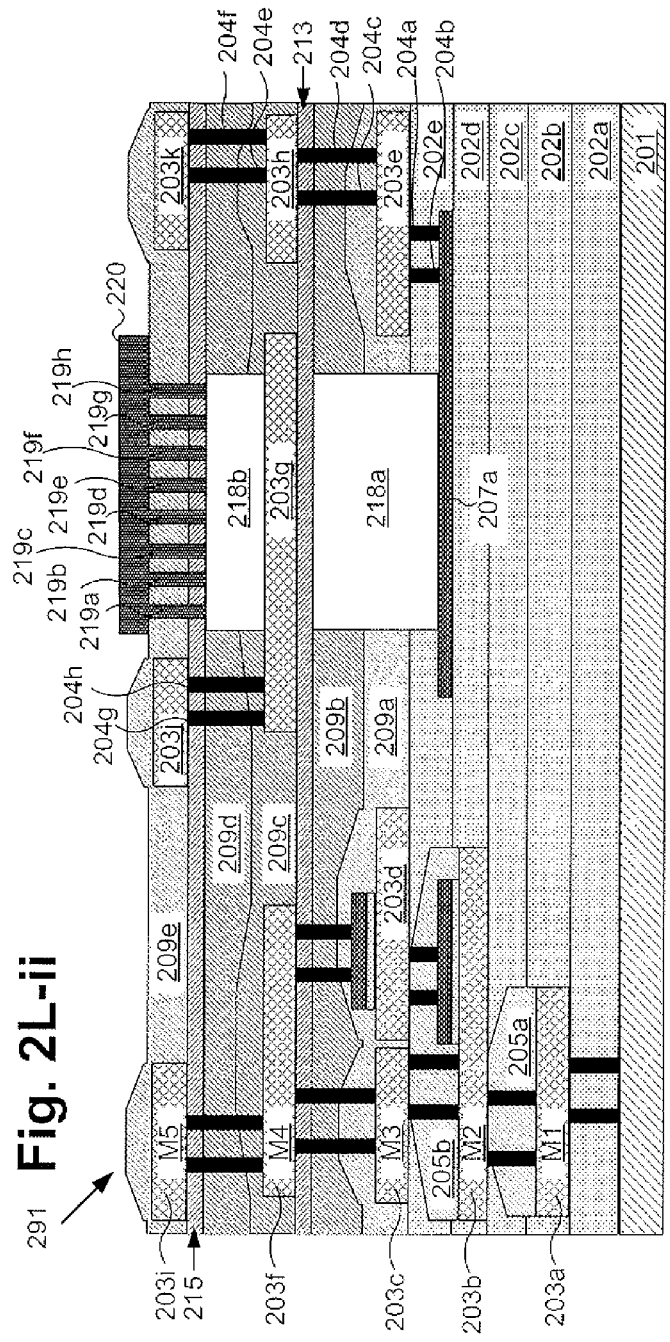
Fig. 2L-i
Fig. 2L-ii

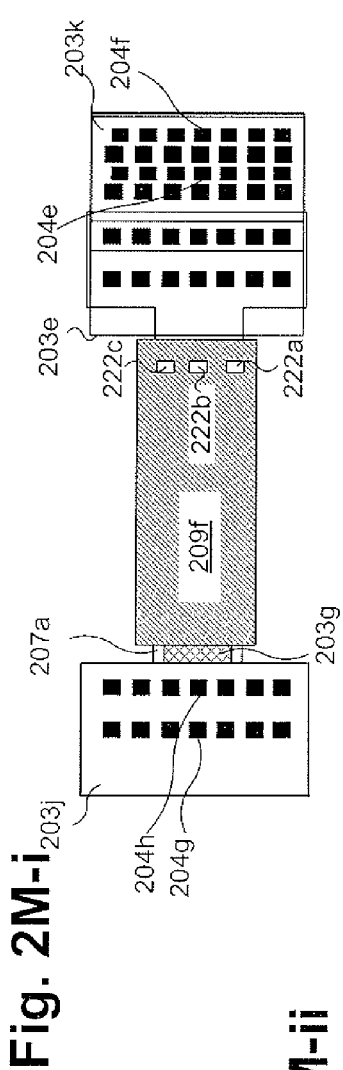

MEMS DEVICE WITH SEALED CAVITY AND RELEASE CHAMBER AND RELATED DOUBLE RELEASE METHOD

The present application claims the benefit of and priority to a provisional patent application titled "Double Release Process for Sealing a MEMS Cavity and Related Structure," Ser. No. 61/914,217, filed on Dec. 10, 2013. The disclosure in this provisional application is hereby incorporated fully by reference into the present application.

BACKGROUND

In Micro Electro Mechanical Systems (MEMS) devices, mechanical and electronic components may be combined to form miniature electronic devices in sealed cavities. Although MEMS devices may take a variety of forms to perform various functions, in general, the cavities which are part of MEMS devices need to be sealed with a particular pressure, such as a sub-atmospheric pressure, to suit the needs of a particular application. Sealing the cavity of a MEMS device at a particular pressure provides the MEMS device with a desired operating pressure, which is designed to be impervious to changes in pressure that may be experienced by unsealed portions of the semiconductor die within which the MEMS device resides.

One commonly utilized technique for forming a sealed MEMS cavity involves a process in which a MEMS cavity is sealed and shut using a sealing layer. However, utilizing a sealing material to seal a MEMS cavity may require various physical and chemical processes that may result in emission of gases from the sealing material into the MEMS cavity. For example, moisture may react with the sealing material to form bubbles in the sealing layer and outgas into the MEMS cavity. Also, some semiconductor wafers may undergo high thermal budget processes after the formation of the sealing layer, which can cause deformation of the sealing material and emission of gases into the MEMS cavity.

The emission of gases from the sealing layer into the MEMS cavity undesirably alters the operating pressure inside of the MEMS cavity, and also contaminates and damages mechanical or electronic components inside the MEMS device, thereby impairing device performance.

SUMMARY

The present disclosure is directed to a MEMS device with sealed cavity and release chamber and related double release method, substantially as shown in and/or described in connection with at least one of the figures, and as set forth more completely in the claims.

BRIEF DESCRIPTION OF THE DRAWINGS

FIG. 1 is a flowchart illustrating a method for fabricating a MEMS device according to one implementation of the present application.

FIG. 2A-i illustrates a top view of a portion of a wafer processed in accordance with an initial action in the flowchart of FIG. 1 according to one implementation of the present application.

FIG. 2A-ii illustrates a cross-sectional view of a portion of a wafer processed in accordance with an initial action in the flowchart of FIG. 1 according to one implementation of the present application.

FIG. 2B-i illustrates a top view of a portion of the wafer processed in accordance with an intermediate action in the flowchart of FIG. 1 according to one implementation of the present application.

FIG. 2B-ii illustrates a cross-sectional view of a portion of the wafer processed in accordance with an intermediate action in the flowchart of FIG. 1 according to one implementation of the present application.

FIG. 2C-i illustrates a top view of a portion of the wafer processed in accordance with an intermediate action in the flowchart of FIG. 1 according to one implementation of the present application.

FIG. 2C-ii illustrates a cross-sectional view of a portion of the wafer processed in accordance with an intermediate action in the flowchart of FIG. 1 according to one implementation of the present application.

FIG. 2D-i illustrates a top view of a portion of the wafer processed in accordance with an intermediate action in the flowchart of FIG. 1 according to one implementation of the present application.

FIG. 2D-ii illustrates a cross-sectional view of a portion of the wafer processed in accordance with an intermediate action in the flowchart of FIG. 1 according to one implementation of the present application.

FIG. 2E-i illustrates a top view of a portion of the wafer processed in accordance with an intermediate action in the flowchart of FIG. 1 according to one implementation of the present application.

FIG. 2E-ii illustrates a cross-sectional view of a portion of the wafer processed in accordance with an intermediate action in the flowchart of FIG. 1 according to one implementation of the present application.

FIG. 2F-i illustrates a top view of a portion of the wafer processed in accordance with an intermediate action in the flowchart of FIG. 1 according to one implementation of the present application.

FIG. 2F-ii illustrates a cross-sectional view of a portion of the wafer processed in accordance with an intermediate action in the flowchart of FIG. 1 according to one implementation of the present application.

FIG. 2G-i illustrates a top view of a portion of the wafer processed in accordance with an intermediate action in the flowchart of FIG. 1 according to one implementation of the present application.

FIG. 2G-ii illustrates a cross-sectional view of a portion of the wafer processed in accordance with an intermediate action in the flowchart of FIG. 1 according to one implementation of the present application.

FIG. 2H-i illustrates a top view of a portion of the wafer processed in accordance with an intermediate action in the flowchart of FIG. 1 according to one implementation of the present application.

FIG. 2H-ii illustrates a cross-sectional view of a portion of the wafer processed in accordance with an intermediate action in the flowchart of FIG. 1 according to one implementation of the present application.

FIG. 2I-i illustrates a top view of a portion of the wafer processed in accordance with an intermediate action in the flowchart of FIG. 1 according to one implementation of the present application.

FIG. 2I-ii illustrates a cross-sectional view of a portion of the wafer processed in accordance with an intermediate action in the flowchart of FIG. 1 according to one implementation of the present application.

FIG. 2I-iii illustrates another cross-sectional view of a portion of the wafer processed in accordance with an intermediate action in the flowchart of FIG. 1 according to one implementation of the present application.

FIG. 2J-i illustrates a top view of a portion of the wafer processed in accordance with an intermediate action in the flowchart of FIG. 1 according to one implementation of the present application.

FIG. 2J-ii illustrates a cross-sectional view of a portion of the wafer processed in accordance with an intermediate action in the flowchart of FIG. 1 according to one implementation of the present application.

FIG. 2K-i illustrates a top view of a portion of the wafer processed in accordance with an intermediate action in the flowchart of FIG. 1 according to one implementation of the present application.

FIG. 2K-ii illustrates a cross-sectional view of a portion of the wafer processed in accordance with an intermediate action in the flowchart of FIG. 1 according to one implementation of the present application.

FIG. 2L-i illustrates a top view of a portion of the wafer processed in accordance with an intermediate action in the flowchart of FIG. 1 according to one implementation of the present application.

FIG. 2L-ii illustrates a cross-sectional view of a portion of the wafer processed in accordance with an intermediate action in the flowchart of FIG. 1 according to one implementation of the present application.

FIG. 2M-i illustrates a top view of a portion of the wafer processed in accordance with an intermediate action in the flowchart of FIG. 1 according to one implementation of the present application.

FIG. 2M-ii illustrates a cross-sectional view of a portion of the wafer processed in accordance with an intermediate action in the flowchart of FIG. 1 according to one implementation of the present application.

DETAILED DESCRIPTION

Figure 2N:
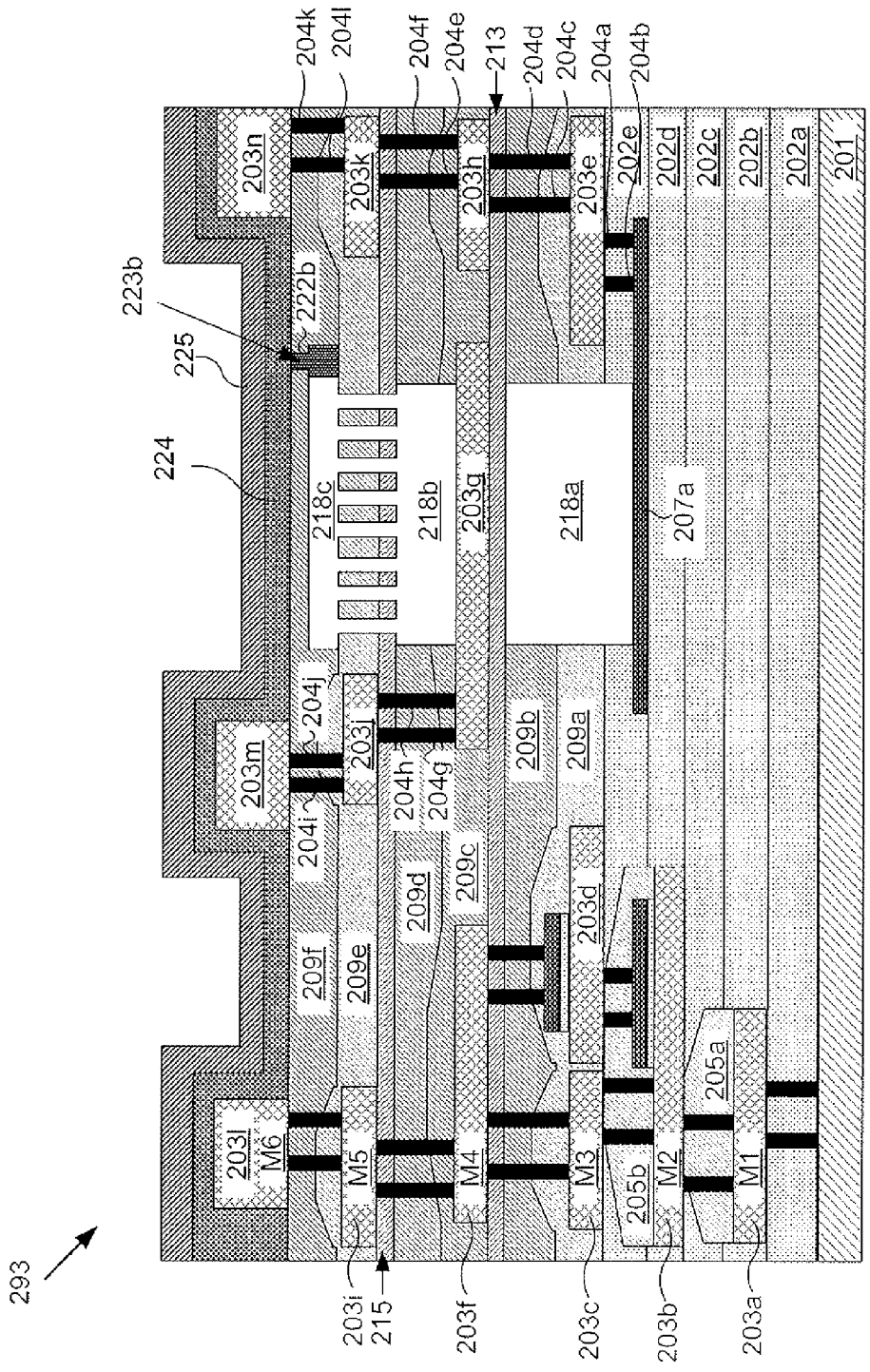
FIG. 2N illustrates a cross-sectional view of a portion of the wafer processed in accordance with a final action in the flowchart of FIG. 1 according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows flowchart 100, which describes the actions, according to one implementation disclosed herein, for fabricating an advantageous MEMS device. Certain details and features have been left out of flowchart 100 that are apparent to a person of ordinary skill in the art. For example, an action may comprise one or more sub actions or may involve specialized equipment or materials, as is known in the art. While actions 180 through 193 indicated in flowchart 100 are sufficient to describe one implementation disclosed herein, other implementations disclosed herein may use actions different from those shown in flowchart 100. FIG. 2A-ii through FIG. 2M-ii, and structures 280 through 292 illustrate the result of performing actions 180 through 192 of flowchart 100 of FIG. 1, respectively. For example, structure 280 shows a portion of a semiconductor wafer after action 180, structure 281 shows structure 280 after action 181, structure 282 shows structure 281 after action 182, and so forth. Structure 293 in FIG. 2N illustrates a cross-sectional view of a portion of a wafer processed in accordance with final action 193 in flowchart 100 of FIG. 1 according to one implementation of the present application.

As shown in flowchart 100, action 180 includes forming a bottom MEMS plate. The result of action 180 is illustrated by reference to FIGS. 2A-i and 2A-ii. FIG. 2A-i illustrates a top view of bottom MEMS plate 207a after completion of action 180 in flowchart 100 of FIG. 1, according to one implementation of the present disclosure. FIG. 2A-ii illustrates exemplary cross-sectional view of structure 280 after completion of action 180 in flowchart 100 of FIG. 1.

As shown in FIG. 2A-ii, structure 280 includes semiconductor substrate 201, dielectric layers 202a, 202b, 202c and 202d, metal segment 203a formed in metal layer M1, metal segment 203b formed in metal layer M2, dielectric materials 205a and 205b, dielectric layer 206 and bottom MEMS plate 207a. As illustrated in FIG. 2A-ii, bottom MEMS plate 207a is formed over a top surface of dielectric layer 202d. Bottom MEMS plate 207a may be a thin resistor layer, a bottom plate of a capacitor, and/or a layer of a passive device. In one implementation, bottom MEMS plate 207a conductive layer 207b may be formed of the same material.

In the present implementation, semiconductor substrate 201 may include, for example, silicon. However, semiconductor substrate 201 is not limited to silicon and may be any appropriate substrate material. In one implementation, semiconductor substrate 201 may be a high resistivity substrate. Dielectric layers 202a, 202b, 202c and 202d may each include oxides (e.g., silicon oxide), nitrides (e.g., silicon nitride), or any other suitable dielectric material. Metal segment 203a may be formed by depositing metal layer M1 over a top surface of dielectric layer 202a and patterning metal layer M1. Metal segment 203b may be formed by depositing metal layer M2 over a top surface of dielectric layer 202c and patterning metal layer M2. In one implementation, metal segment 203b may form a bottom plate of a first metal-insulator-metal (MIM) capacitor. Conductive layer 207b, which may form a top metal plate for the first MIM capacitor, is disposed over metal segment 203b and separated from metal segment 203b by dielectric layer 206. Thus, metal segment 203b, dielectric layer 206 and conductive layer 207b may form the first MIM capacitor in structure 280. Dielectric material 205a may be formed over metal segment 203a. Dielectric material 205b may be formed over metal segment 203b, and cover dielectric layer 206 and conductive layer 207b.

Metal segment 203a is electrically coupled to metal segment 203b by conductive vias as shown in FIG. 2A-ii. The conductive vias may be formed by etching vias through dielectric layer 202c and dielectric material 205a, depositing conductive material in the vias, and planarizing the conductive material with a top surface of dielectric layer 202c. The conductive vias may include, for example, tungsten, copper, aluminum, or any other suitable conductive material.

Referring to flowchart 100 of FIG. 1, action 181 includes forming a dielectric layer and conductive vias over the bottom MEMS plate. The result of action 181 is illustrated by reference to FIGS. 2B-i and 2B-ii. FIG. 2B-i illustrates a top view of bottom MEMS plate 207a after completion of action 181 in flowchart 100 of FIG. 1, according to one implementation of the present disclosure. FIG. 2B-ii illustrates exemplary cross-sectional view of structure 281 after completion of action 181 in flowchart 100 of FIG. 1.

As shown in FIG. 2B-i, dielectric layer 202e (shown in exemplary cross-sectional view of structure 281 in FIG. 2B-ii) and a plurality of conductive vias, such as conductive vias 204a and 204b, are formed over bottom MEMS plate 207a. As shown in FIG. 2B-ii, structure 281 includes dielectric layer 202e and conductive vias 204a and 204b formed over bottom MEMS plate 207a. Dielectric layer 202e may include oxides, nitrides, or any other suitable dielectric material. Conductive vias 204a and 204b extend through dielectric layer 202e to reach bottom MEMS plate 207a.

As shown in FIG. 2B-ii, electrical connections to metal segment 203b and conductive layer 207b are also formed using conductive vias, which may be formed concurrently with conductive vias 204a and 204b. The conductive vias, including conductive vias 204a and 204b, are planarized to have a coplanar top surface with dielectric layer 202e.

Referring to flowchart 100 of FIG. 1, action 182 includes forming metal segments over the dielectric layer. The result of action 182 is illustrated by reference to FIGS. 2C-i and 2C-ii. FIG. 2C-i illustrates a top view of bottom MEMS plate 207a, conductive vias 204a and 204b, and metal segment 203e after completion of action 182 in flowchart 100 of FIG. 1, according to one implementation of the present disclosure. FIG. 2C-ii illustrates exemplary cross-sectional view of structure 282 after completion of action 182 in flowchart 100 of FIG. 1.

As shown in FIG. 2C-ii, structure 282 includes metal segments 203c, 203d and 203e, conductive layer 207c and dielectric layer 208. Metal segment 203b and conductive layer 207b are electrically connect to metal segment 203c and metal segment 203d, respectively, through conductive vias. Metal segment 203d may form a bottom plate of a second MIM capacitor. Conductive layer 207c, which may form a top metal plate for the second MIM capacitor, is disposed over metal segment 203d and separated from metal segment 203d by dielectric layer 208. Thus, metal segment 203d, dielectric layer 208 and conductive layer 207c form the second MIM capacitor. As also shown in FIG. 2C-ii, metal segment 203e is formed over dielectric layer 202e and electrically connected to bottom MEMS plate 207a through conductive vias 204a and 204b.

Referring to flowchart 100 of FIG. 1, action 183 includes forming a conformal dielectric layer over the metal segments. The result of action 183 is illustrated by reference to FIGS. 2D-i and 2D-ii. FIG. 2D-i illustrates a top view of bottom MEMS plate 207a, conductive vias 204a and 204b, and metal segment 203e after completion of action 183 in flowchart 100 of FIG. 1, according to one implementation of the present disclosure. FIG. 2D-ii illustrates exemplary cross-sectional view of structure 283 after completion of action 183 in flowchart 100 of FIG. 1.

As shown in FIG. 2D-i, conformal dielectric layer 209a (shown in exemplary cross-sectional view of structure 283 in FIG. 2D-ii) is formed over metal segment 203e. As illustrated in FIG. 2D-ii, structure 283 includes conformal dielectric layer 209a over metal segments 203c, 203d and 203e, conductive layer 207c, dielectric layer 208, and portions of a top surface of dielectric layer 202e. Conformal dielectric layer 209a may be formed of any suitable dielectric material, such as oxides and nitrides.

Referring to flowchart 100 of FIG. 1, action 184 includes forming a blanket dielectric layer over the conformal dielectric layer. The result of action 184 is illustrated by reference to FIGS. 2E-i and 2E-ii. FIG. 2E-i illustrates a top view of bottom MEMS plate 207a, conductive vias 204a and 204b, and metal segment 203e after completion of action 184 in flowchart 100 of FIG. 1, according to one implementation of the present disclosure. FIG. 2E-ii illustrates exemplary cross-sectional view of structure 284 after completion of action 184 in flowchart 100 of FIG. 1.

As shown in FIG. 2E-i, blanket dielectric layer 209b is formed over conformal dielectric layer 209a (shown in exemplary cross-sectional view of structure 284 in FIG. 2E-ii). As illustrated in FIG. 2E-ii, structure 284 includes blanket dielectric layer 209b over conformal dielectric layer 209a. In one implementation, blanket dielectric layer 209b may be formed over conformal dielectric layer 209a and planarized using chemical mechanical polishing (CMP), for example. Blanket dielectric layer 209b may be formed of any suitable dielectric material, such as oxides and nitrides. In one implementation, blanket dielectric layer 209b may be formed of the same material as conformal dielectric layer 209a. In another implementation, conformal dielectric layer 209a and blanket dielectric layer 209b may be formed of different materials.

Referring to flowchart 100 of FIG. 1, action 185 includes forming a first opening in the blanket dielectric layer, the conformal dielectric layer and the dielectric layer over the bottom MEMS plate. The result of action 185 is illustrated by reference to FIGS. 2F-i and 2F-ii. FIG. 2F-i illustrates a top view of opening 211a, bottom MEMS plate 207a, conductive vias 204a and 204b, and metal segment 203e after completion of action 185 in flowchart 100 of FIG. 1, according to one implementation of the present disclosure. FIG. 2F-ii illustrates exemplary cross-sectional view of structure 285 after completion of action 185 in flowchart 100 of FIG. 1.

As shown in FIG. 2F-i, opening 211a is formed over bottom MEMS plate 207a. In the present implementation, width 228 of opening 211a is greater than width 230 of bottom MEMS plate 207a. In other implementations, width 228 of opening 211a may be less than or equal to width 230 of bottom MEMS plate 207a.

As shown in FIG. 2F-ii, structure 285 includes opening 211a extending through blanket dielectric layer 209b, conformal dielectric layer 209a and dielectric layer dielectric layer 202e, and exposing a top surface of bottom MEMS plate 207a. Various etching techniques may be employed to create opening 211a. In one implementation, opening 211a may be created by wet etching, such as isotropic etching and hydrofluoric etching. In another implementation, opening 211a may be created by dry etching, such as vapor etching and plasma etching.

Referring to flowchart 100 of FIG. 1, action 186 includes filling the first opening with a first sacrificial material and forming a MEMS dielectric layer over the first sacrificial material. The result of action 186 is illustrated by reference to FIGS. 2G-i and 2G-ii. FIG. 2G-i illustrates a top view of sacrificial material 212 in opening 211a, bottom MEMS plate 207a, conductive vias 204a and 204b, and metal segment 203e after completion of action 186 in flowchart 100 of FIG. 1, according to one implementation of the present disclosure.

FIG. 2G-ii illustrates exemplary cross-sectional view of structure 286 after completion of action 186 in flowchart 100 of FIG. 1.

As shown in FIG. 2G-ii, structure 286 includes sacrificial material 212 deposited in opening 211a, and MEMS dielectric layer 213 over sacrificial material 212 and blanket dielectric layer 209b. Sacrificial material 212 may include polymeric material, Group-IV semiconductor materials (e.g., silicon-based material, amorphous silicon, germanium, amorphous germanium, and silicon-germanium), and dielectric materials (e.g., oxide and nitride materials). In case sacrificial material 212 is formed of a dielectric material, sacrificial material 212 should be formed of a dielectric material different than the materials used for blanket dielectric layer 209b, conformal dielectric layer 209a and dielectric layer 202e, so that the removal of sacrificial material 212 is selective and does not cause damage to the dielectric layers surrounding opening 211a. For example, if an oxide-based material (e.g., silicon oxide) is used to form blanket dielectric layer 209b, conformal dielectric layer 209a and dielectric layer 202e, then a non-oxide based material, such as a nitride-based material (e.g., silicon nitride) may be used as sacrificial material 212 in opening 211a.

After depositing sacrificial material 212, an upper surface of sacrificial material 212 is planarized such that sacrificial material 212 and portions of blanket dielectric layer 209b have a coplanar top surface. MEMS dielectric layer 213 is then formed on the coplanar surface of sacrificial material 212 and blanket dielectric layer 209b. In one implementation, MEMS dielectric layer 213 may be omitted from the MEMS device.

Referring to flowchart 100 of FIG. 1, action 187 includes forming a top MEMS plate over the first sacrificial material over the bottom MEMS plate, and forming a second opening over the top MEMS plate. The result of action 187 is illustrated by reference to FIGS. 2H-i and 2H-ii. FIG. 2H-i illustrates a top view of top MEMS plate 203g over sacrificial material 212 after completion of action 187 in flowchart 100 of FIG. 1, according to one implementation of the present disclosure. FIG. 2H-ii illustrates exemplary cross-sectional view of structure 287 after completion of action 187 in flowchart 100 of FIG. 1.

As shown in FIG. 2H-i, top MEMS plate 203g is formed over sacrificial material 212. In the present implementation, top MEMS plate 203g includes at least one segment that is narrower than bottom MEMS plate 207a. For example, as illustrated in FIG. 2H-i, width 232 of top MEMS plate 203g is narrower than width 230 of bottom MEMS plate 207a. Because top MEMS plate 203g is narrower than bottom MEMS plate 207a and opening 211a, sacrificial material 212 in opening 211a is exposed in regions 217a and 217b beyond width 232 of top MEMS plate 203g. Thus, regions 217a and 217b allow sacrificial material 212 to be in contact with another sacrificial material formed in opening 211b (shown in exemplary cross-sectional view of structure 288 in FIG. 2I-ii).

As shown in FIG. 2H-ii, structure 287 includes conductive vias 204c and 204d, and metal segments 203f and 203h, top MEMS plate 203g, conformal dielectric layer 209c, blanket dielectric layer 209d and opening 211b. Metal segments 203h is electrically connected to metal segment 203e through conductive vias 204c and 204d. Also, metal segment 203c and conductive layer 207c are electrically connected to metal segment 203f through conductive vias. In one implementation, metal segments 203f and 203h in metal layer M4 may be part of a standard circuitry, while top MEMS plate 203g in metal layer M4 may be a top MEMS plate for a MEMS device, such as an actuator element or a vibrating element of a resonator.

Conformal dielectric layer 209c is formed over and covers metal segments 203f and 203h, top MEMS plate 203g, and portions of a top surface of MEMS dielectric layer 213. Blanket dielectric layer 209d may be formed over conformal dielectric layer 209c and planarized using chemical mechanical polishing (CMP), for example. Conformal dielectric layer 209c and blanket dielectric layer 209d may be formed of any suitable dielectric material, such as oxides and nitrides. In one implementation, blanket dielectric layer 209d may be formed of the same material as conformal dielectric layer 209c. In another implementation, conformal dielectric layer 209c and blanket dielectric layer 209d may be formed of different materials.

As further shown in FIG. 2H-ii, opening 211b may be formed in structure 287, for example, by an etching process substantially similar to the etching process used to form opening 211a discussed above. Opening 211b may expose a top surface of top MEMS plate 203g, and may have a width substantially the same as width 228 of opening 211a. In one implementation, openings 211a and 211b may be partially separated by top MEMS plate 203g, and in communication with each other in regions 217a and 217b beyond width 232 of top MEMS plate 203g.

Referring to flowchart 100 of FIG. 1, action 188 includes filling the second opening with a second sacrificial material, and forming a first sealing layer over the second sacrificial material over the top MEMS plate. The result of action 188 is illustrated by reference to FIGS. 2I-i, 2I-ii, and 2I-iii. FIG. 2I-i illustrates a top view of sacrificial material 214 in opening 211b after completion of action 186 in flowchart 100 of FIG. 1, according to one implementation of the present disclosure. FIG. 2I-ii illustrates exemplary cross-sectional view of structure 288 after completion of action 188 in flowchart 100 of FIG. 1. FIG. 2I-iii illustrates exemplary cross-sectional view of structure 288 along line A-A' in FIG. 2I-i after completion of action 188 in flowchart 100 of FIG. 1.

As shown in FIG. 2I-i, sacrificial material 214 is deposited in opening 211b. In the present implementation, width 234 of opening 211b is substantially the same as width 228 of opening 211a (shown in FIG. 2F-ii). Thus, width 234 of opening 211b is greater than width 232 of top MEMS plate 203g. In other implementations, width 234 of opening 211b may be smaller or greater than width 228 of opening 211a.

As shown in FIG. 2I-ii, structure 288 includes sacrificial material 214, conductive vias 204e, 204f, 204g and 204h, barrier dielectric layer 215, metal segments 203i, 203j and 203k, and first sealing layer 209e. Opening 211b is filled with sacrificial material 214. Since openings 211a and 211b are connected to each other at regions 217a and 217b, for example, sacrificial material 214 is in direct contact with sacrificial material 212 in opening 211a. In one implementation, sacrificial materials 212 and 214 may be formed of the same material, for example, amorphous silicon. However, sacrificial materials 212 and 214 may be formed of different materials. For example, sacrificial material 212 may include group-II semiconductor materials, and sacrificial material 214 may include group-I and/or group-III semiconductor materials. For example, sacrificial material 212 may be amorphous silicon. Sacrificial material 214 may be polymeric material (e.g., polyimide) or dielectric material. In case where sacrificial materials 212 and 214 are made of different materials, a different release agent may be used to release each sacrificial material. Sacrificial material 214 is then planarized such that a top surface of sacrificial material 214 is coplanar with a top surface of blanket dielectric layer 209d.

As further shown in FIG. 2I-ii, barrier dielectric layer 215 is optionally formed over the coplanar surface of sacrificial material 214 and blanket dielectric layer 209d. Barrier dielectric layer 215 may be an oxide or nitride layer. In one implementation, barrier dielectric layer 215 may act as an etch-stop layer to protect sacrificial material 214 in opening 211b, when metal layer M5 is formed and patterned to form metal segments 203i, 203j and 203k. As such, the etching of metal layer M5 stops on barrier dielectric layer 215 without penetrating through sacrificial material 214. For example, if amorphous silicon is used as sacrificial material 214 in opening 211b, the metal etch of metal layer M5 would have attacked the silicon if a dielectric layer were not used as an etch-stop layer. However, with barrier dielectric layer 215 between metal layer M5 and sacrificial material 214, sacrificial material 214, such as amorphous silicon, can be protected during the formation of metal segments 203i, 203j and 203k. In another example, if a polymer is used as sacrificial material 214 in opening 211b, barrier dielectric layer 215 would provide a barrier or an isolation layer between metal layer M5 and sacrificial material 214 during the deposition and patterning of metal layer M5.

After barrier dielectric layer 215 is deposited, conductive vias, such as conductive vias 204e, 204f, 204g and 204h, and metal segments 203i, 203j and 203k are formed. Conductive vias 204e and 204f electrically connect metal segment 203h and metal segment 203k. Conductive vias 204g and 204h electrically connect top MEMS plate 203g and metal segment 203j. Also, metal segment 203f and metal segment 203i are also connected through conductive vias. Thereafter, first sealing layer 209e is formed over metal segments 203i, 203j and 203k, and a top surface of barrier dielectric layer 215 over sacrificial material 214. First sealing layer 209e may be formed of any suitable dielectric material. In one implementation, first sealing layer 209e may be a silicon oxide layer, and barrier dielectric layer 215 may be a silicon nitride layer. However, first sealing layer 209e and barrier dielectric layer 215 need not be formed of different materials.

As shown in FIG. 2I-iii, width 234 of opening 211b is greater than width 232 of top MEMS plate 203g. Also, width 232 of top MEMS plate 203g is narrower than width 230 of bottom MEMS plate 207a. Because top MEMS plate 203g is narrower than bottom MEMS plate 207a and openings 211a and 211b, sacrificial material 212 in opening 211a and sacrificial material 214 in opening 211b are in contact to each other in regions 217a and 217b. As such, sacrificial material 212 and sacrificial material 214 can be subsequently released in a single processing action.

Referring to flowchart 100 of FIG. 1, action 189 includes forming a first plurality of release holes in the first sealing layer, the first plurality of release holes reaching the second sacrificial material. The result of action 189 is illustrated by reference to FIGS. 2J-i and 2J-ii. FIG. 2J-i illustrates a top view of first plurality of release holes 216a through 216h extending through first sealing layer 209e and barrier dielectric layer 215, and reaching sacrificial material 214. FIG. 2J-ii illustrates exemplary cross-sectional view of structure 287 after completion of action 189 in flowchart 100 of FIG. 1.

As shown in FIG. 2J-ii, structure 289 includes first plurality of release holes 216a through 216h formed in first sealing layer 209e and barrier dielectric layer 215. First plurality of release holes 216a through 216h may be formed by etching through first sealing layer 209e and barrier dielectric layer 215. It is important that first plurality of release holes 216a through 216h make contact with sacrificial material 214 in opening 211b, so that first plurality of release holes 216a through 216h can be used to release sacrificial materials 212 and 214 during a subsequent release action as discussed below.

Referring to flowchart 100 of FIG. 1, action 190 includes performing a first release to remove the first and second sacrificial materials situated under and over the top MEMS plate through the first plurality of release holes, thereby forming an upper chamber between the first sealing layer and the top MEMS plate, and a lower chamber between the top MEMS plate and the bottom MEMS plate. The result of action 190 is illustrated by reference to FIGS. 2K-i and 2K-ii. FIG. 2K-i illustrates a top view of first sealing layer 209e after the first release, where sacrificial material 212 sacrificial material 214 have been released through first plurality of release holes 216a through 216h. FIG. 2K-ii illustrates exemplary cross-sectional view of structure 289 after completion of action 190 in flowchart 100 of FIG. 1.

As shown in FIG. 2K-ii, structure 290 includes lower chamber 218a between bottom MEMS plate 207a and top MEMS plate 203g, and upper chamber 218b between top MEMS plate 203g and first sealing layer 209e after sacrificial material 212 sacrificial material 214 have been released through first plurality of release holes 216a through 216h. Because sacrificial materials 212 and 214 are directly connected at regions 217a and 217b, as shown in FIGS. 2I-i and 2I-iii, sacrificial materials 212 and 214 can be released through a single release process during the first release through first plurality of release holes 216a through 216h in first sealing layer 209e.

In one implementation, regions 217a and 217b may have sufficient extension beyond width 232 of top MEMS plate 203g to allow for a clean removal. In other implementations, the connection between sacrificial materials 212 and 214 can be made at various locations within and/or beyond the interior of top MEMS plate 203g. The particular location may depend on the geometry, length, and scale of various MEMS devices. For example, sacrificial materials 212 and 214 may be connected by one or more through-holes in the center of top MEMS plate 203g, as discussed in FIG. 4 below.

The removal of sacrificial materials 212 and 214 can be carried out by various removal techniques, preferably in a gas or vapor form. It can also be carried out in a liquid form. To remove sacrificial materials 212 and 214, a removal agent may be applied through first plurality of release holes 216a through 216h, the removal agent may then etch away sacrificial materials 212 and 214 by either wet or dry isotropic etching, in which isotropic plasma or vapor may be used to etch away the sacrificial materials. For example, if sacrificial materials 212 and/or 214 include an organic polymer, such as polyimide, then an isotropic oxygen plasma etch may be used to remove the polymeric sacrificial materials. If sacrificial materials 212 and/or 214 include an inorganic oxide, such as silicon dioxide ($SiO_2$), then a fluoride based etchant, such as a hydrofluoric acid vapor ("HF") etchant can be used to attack and remove the oxide sacrificial materials. If sacrificial materials 212 and/or 214 include a silicon-based material, such as amorphous silicon, then a fluorine-based material, such as $NF_3$, can be used to attack and remove the silicon-based sacrificial materials.

The removal of sacrificial materials 212 and 214 must be selective to preserve top MEMS plate 203g. If top MEMS plate 203g constitutes a moving part of a MEMS device, for example, then a dry etch process would be advantageous so as to avoid potential sources of residue from a wet etch that can cause problems, such as causing "stiction" (i.e., static friction) of the moving part of the MEMS device. Thereafter, the byproduct or reactant of the removal agent and sacrificial materials 212 and 214 may turn into gas, vapor or liquid, which may be released through first plurality of release holes 216a through 216h. In one implementation, the gas, vapor or liquid may be sucked out or pumped out of structure 290 through an exhaust of a processing tool. During the removal process, the processing tool itself may be set at a slightly sub-atmosphere pressure, or have pumping.

After the removal of sacrificial materials 212 and 214, in one implementation, structure 290 may be taken out of the processing tool. As such, an atmosphere pressure of lower chamber 218a and upper chamber 218b would be the same as their ambient environmental conductions, such clean room air, surrounding structure 290. In other implementations, after the removal of sacrificial materials 212 and 214, structure 290 may be moved to a subsequent processing step without breaking the vacuumed conditions inside the processing tool.

Referring to flowchart 100 of FIG. 1, action 191 includes forming a sacrificial capping layer over the first sealing layer, the sacrificial capping layer having a first plurality of overlying plugs filling the first plurality of release holes in the first sealing layer. The result of action 191 is illustrated by reference to FIGS. 2L-i and 2L-ii. FIG. 2L-i illustrates a top view of sacrificial capping layer 220 having first plurality of overlying plugs (e.g., sacrificial overlying plugs 219a through 219h) filling first plurality of release holes 216a through 216h in first sealing layer 209e, as shown in FIG. 2L-ii, after completion of action 191 in flowchart 100 of FIG. 1, according to one implementation of the present disclosure. FIG. 2L-ii illustrates exemplary cross-sectional view of structure 291 after completion of action 191 in flowchart 100 of FIG. 1.

As shown in FIG. 2L-ii, structure 291 includes sacrificial capping layer 220 having sacrificial overlying plugs 219a through 219h filling first plurality of release holes 216a through 216h, as shown in FIG. 2K-ii, in first sealing layer 209e and barrier dielectric layer 215. First plurality of release holes 216a through 216h are plugged and sealed by sacrificial capping layer 220 having sacrificial overlying plugs 219a through 219h under a first controlled environment, such that lower chamber 218a and upper chamber 218b may be sealed at a desired pressure throughout the entire space formed by lower chamber 218a and upper chamber 218b. In one implementation, sealed lower chamber 218a and upper chamber 218b have substantially the same pressure. In one implementation, a gaseous chemistry, such as helium gas, may be filled inside of sealed lower chamber 218a and upper chamber 218b.

As shown in FIG. 2L-ii, sacrificial capping layer 220 is formed over first sealing layer 209e, and extends toward metal segment 203k away from the lateral dimensions of lower chamber 218a and upper chamber 218b. As discussed below, the extended portion of sacrificial capping layer 220 provides a top contact surface for connecting a second plurality of release holes to be formed in a subsequent step. In another implementation, sacrificial capping layer 220 may include one or more circuitous paths over first sealing layer 209e to allow better control of the removal of sacrificial capping layer 220 in a subsequent release process.

Suitable material for sacrificial capping layer 220 having sacrificial overlying plugs 219a through 219h may include polymeric material, dielectric material and metallic material. If an oxide or a metal is used for sacrificial capping layer 220, then a physical vapor deposition (PVD) or a chemical vapor deposition (CVD) may be used for blanket oxide deposition or metal deposition. For example, a PVD of sacrificial capping layer 220 can be carried out in a high vacuum, such that the sealed upper and lower chambers of the MEMS device may have an atmosphere pressure on the order of $10^{-6}$ Torr. Also, a CVD of sacrificial capping layer 220 can be carried out in a mid-range vacuum, such that the sealed upper and lower chambers of the MEMS device may have an atmosphere pressure on the order of $20 \times 10^{-3}$ Torr. If a polymer is used as sacrificial capping layer 220, sacrificial capping layer 220 can be spin coated to seal and plug first plurality of release holes 216a through 216h, while structure 291 is placed under a controlled environment, such as in clean room air, for example. In one implementation, structure 291 may be taken out of the processing tool, and placed in a cluster tool or another chamber during the deposition of sacrificial capping layer 220 under a controlled environment. In another implementation, structure 291 may be placed into a deposition chamber during the deposition of sacrificial capping layer 220 without breaking the vacuum conditions. In yet another implementation, structure 291 may stay in the processing tool during the deposition of sacrificial capping layer 220.

Referring to flowchart 100 of FIG. 1, action 192 includes forming a second sealing layer over the sacrificial capping layer, and performing a second release to remove the sacrificial capping layer through a second plurality of release holes in the second sealing layer, thereby forming a release chamber between the first sealing layer and the second sealing layer. The result of action 192 is illustrated by reference to FIGS. 2M-i and 2M-ii. FIG. 2M-i illustrates a top view of second sealing layer 209f having second plurality of release holes 222a, 222b and 222c for releasing sacrificial capping layer 220 after completion of action 192 in flowchart 100 of FIG. 1, according to one implementation of the present disclosure. FIG. 2M-ii illustrates exemplary cross-sectional view of structure 292 after completion of action 192 in flowchart 100 of FIG. 1.

As shown in FIG. 2M-ii, structure 292 includes second sealing layer 209f, release chamber 218c and release hole 222b of second plurality of release holes 222a, 222b and 222c shown in FIG. 2M-i. Structure 292 also includes conductive vias 204i and 204j connected to meal segment 203j, and conductive vias 204k and 204l connected to metal segment 203k.

Second sealing layer 209f is formed over first sealing layer 209e and sacrificial capping layer 220, and planarized by CMP, for example, to form a top planar surface. Second sealing layer 209f may be formed of any suitable dielectric material, such as an oxide or a nitride layer. In one implementation, second sealing layer 209f may be formed of the same material as first sealing layer 209e. In another implementation, first sealing layer 209e and second sealing layer 209f may be formed of different materials.

As shown in FIGS. 2M-i and 2M-ii, second plurality of release holes 222a, 222b and 222c extend through second sealing layer 209f, and make contact with sacrificial capping layer 220 toward an outer edge thereof. In one implementation, second plurality of release holes 222a, 222b and 222c may make contact with sacrificial capping layer 220 in areas away from an area directly above lower chamber 218a and upper chamber 218b. In another implementation, second plurality of release holes 222a, 222b and 222c may make contact with sacrificial capping layer 220 in areas away from first plurality of release holes 216a through 216h. In other implementations, second plurality of release holes 222a, 222b and 222c may make contact with sacrificial capping layer 220 in various other locations. Second plurality of release holes 222a, 222b and 222c are located away from lower chamber 218a and upper chamber 218b so that the second release process, which removes sacrificial capping layer 220, causes minimum or no damage to release chamber 218c, upper chamber 218b and lower chamber 218a. In one implementation, second plurality of release holes 222a, 222b and 222c may be formed by etching through second sealing layer 209f to reach a top surface of sacrificial capping layer 220.

As shown in FIGS. 2M-i and 2M-ii, sacrificial capping layer 220 is removed through second plurality of release holes 222a, 222b and 222c. As discussed above, suitable material for sacrificial capping layer 220 may include polymeric materials, oxide materials, and metals. The removal of sacrificial capping layer 220 can be done by a variety of methods, preferably in gas or vapor form. It can also be carried out in liquid form. To remove sacrificial capping layer 220, a removal agent may be applied through second plurality of release holes 222a, 222b and 222c, the removal agent may then etch away sacrificial capping layer 220 by either wet or dry isotropic etching, in which an isotropic plasma or vapor may be used to etch away the sealing layer. If sacrificial capping layer 220 includes an organic polymer, such as polyimide, then an isotropic oxygen plasma etch may be used to remove the polymeric sealing material. If sacrificial capping layer 220 includes an inorganic oxide, such as silicon dioxide ($SiO_2$), then a fluoride based etchant, such as a hydrofluoric acid vapor ("HF") etchant may be used to attack and remove the oxide sealing material. If sacrificial capping layer 220 includes a silicon-based material, such as amorphous silicon, then a fluorine-based material, such as $NF_3$, may be used to attack and remove the silicon-based sacrificial material.

The removal of sacrificial capping layer 220 is selective to preserve first sealing layer 209e, second sealing layer 209f and barrier dielectric layer 215 surrounding sacrificial capping layer 220. In case sacrificial capping layer 220 is formed of a dielectric material, the dielectric material should be different than the dielectric materials used for first sealing layer 209e, second sealing layer 209f and barrier dielectric layer 215, so that the removal of sacrificial capping layer 220 does not cause damage to the dielectric layers surrounding sacrificial capping layer 220. For example, if an oxide-based material (e.g., silicon oxide) is used to form first sealing layer 209e, second sealing layer 209f and barrier dielectric layer 215, then a non-oxide based material, such as a nitride-based material (e.g., silicon nitride) may be used as sacrificial capping layer 220.

If a polymeric or metallic material is used as sacrificial capping layer 220, the polymeric or metallic material in sacrificial capping layer 220 may have a tendency to emit gasses into the sealed lower chamber 218a and upper chamber 218b, thereby undesirably affecting the pressure and chemistry of the sealed first controlled environment, for example. Thus, the second release of removing sacrificial capping layer 220 creates release chamber in structure 292, and provides an opportunity to execute a re-seal process to form a second controlled environment in the lower, upper and release chambers.

Referring to flowchart 100 of FIG. 1, action 193 includes plugging the second plurality of release holes using a second plurality of overlying plugs. The result of action 193 is illustrated by reference to FIG. 2N. As shown in FIG. 2N, structure 293 includes second plurality of overlying plugs, such as overlying plug 223b, filling second plurality of release holes, such as release hole 222b. Structure 293 also includes conductive vias 204i, 204j, 204k and 204l, metal segments 203l, 203m and 203n, passivation layers 224 and 225.

In the present implementation, second plurality of overlying plugs, such as overlying plug 223b, are plugged and sealed by second plurality of release holes, such as release hole 222b under a second controlled environment, such that lower chamber 218a, upper chamber 218b and release chamber 218c can be kept in a second controlled environment. For example, lower chamber 218a, upper chamber 218b and release chamber 218c can be sealed at a desired pressure throughout the entire space formed by lower chamber 218a, upper chamber 218b and release chamber 218c. In one implementation, sealed lower chamber 218a, upper chamber 218b and release chamber 218c have substantially the same or similar pressure. In one implementation, a gaseous chemistry, such as helium gas, may be filled inside of the sealed lower chamber 218a, upper chamber 218b and release chamber 218c, such that the sealed lower chamber 218a, upper chamber 218b and release chamber 218c have substantially the same or similar gaseous chemistry.

Suitable material for second plurality of overlying plugs, such as overlying plug 223b, may include polymeric materials, oxide materials, and metals. A physical vapor deposition (PVD) or a chemical vapor deposition (CVD) can be used for blanket oxide deposition or metal deposition. If a polymer is used as second plurality of overlying plugs, second plurality of overlying plugs can be spin coated to seal and plug release hole 222b. In one implementation, structure 293 is placed under in a controlled atmosphere, and a polymer is deposited to plug and seal second plurality of release holes, such as release hole 222b, in the controlled atmosphere. In another implementation, a blanket oxide deposition may be used to plug and seal second plurality of release holes, such as release hole 222b, in a controlled atmosphere. In yet another implementation, metals, such as tungsten, may also be used as second plurality of overlying plugs, such as overlying plug 223b, to plug and seal second plurality of release holes, such as release hole 222b under a controlled environment.

In one implementation, second plurality of overlying plugs, such as overlying plug 223b, can be deposited in second plurality of release holes, such as release hole 222b, by a physical vapor deposition (PVD). For example, a PVD can be carried out in a high vacuum, so that sealed lower chamber 218a, upper chamber 218b and release chamber 218c may have an atmosphere pressure on the order of $10^{-6}$ Torr. In another implementation, second plurality of overlying plugs, such as overlying plug 223b, can be deposited in second plurality of release holes, such as release hole 222b, by a chemical vapor deposition (CVD). For example, a CVD can be carried out in a mid-range vacuum, so that sealed lower chamber 218a, upper chamber 218b and release chamber 218c may have an atmosphere pressure on the order of $20 \times 10^{-3}$ Torr. Thus, as the second release removes sacrificial capping layer 220 thus creating release chamber 218c, the re-seal of lower chamber 218a, upper chamber 218b and release chamber 218c using second plurality of overlying plugs, such as overlying plug 223b, results in a second controlled environment, that is substantially cleaner and well controlled than the first controlled environment formed in lower chamber 218a and upper chamber 218b which are sealed by sacrificial capping layer 220.

As shown in FIG. 2N, conductive vias 204i and 204j electrically connect metal segment 203j to metal segment 203m, which may serve as an external contact pad for top MEMS plate 203g. Conductive vias 204k and 204l electrically connect metal segment 203k to metal segment 203n, which may serve as an external contact pad for bottom MEMS plate 207a. Also, metal segment 203i and metal segment 203l are connected through conductive vias. Metal segments 203l, 203m and 203n may be formed of different metals in metal layer M6. In one implementation, metal layer M6 is formed on the top surface of second sealing layer 209f, and patterned to form metal segments 203l, 203m and 203n. Passivation layers 224 and 225 are deposited over metal segments 203*l*, 203*m* and 203*n*, and the top surface of second sealing layer 209*f*. In one implementation, passivation layer 224 may be a silicon oxide layer, and passivation layer 225 may be a silicon nitride layer.

As further shown in FIG. 2N, bottom MEMS plate 207*a* is electrically connected to metal segment 203*n* through metal segments 203*e*, 203*h* and 203*k*, and conductive vias 204*a*, 204*b*, 204*c*, 204*d*, 204*e*, 204*f*, 204*k* and 204*l*. Also, top MEMS plate 203*g* is electrically connected to metal segment 203*m* through metal segment 203*j* and conductive vias 204*g*, 204*h*, 204*i* and 204*j*. Thus, metal segments 203*m* and 203*n* can be used as external contact pads for top MEMS plate 203*g* and bottom MEMS plate 207*a*, respectively.

Figure 3:
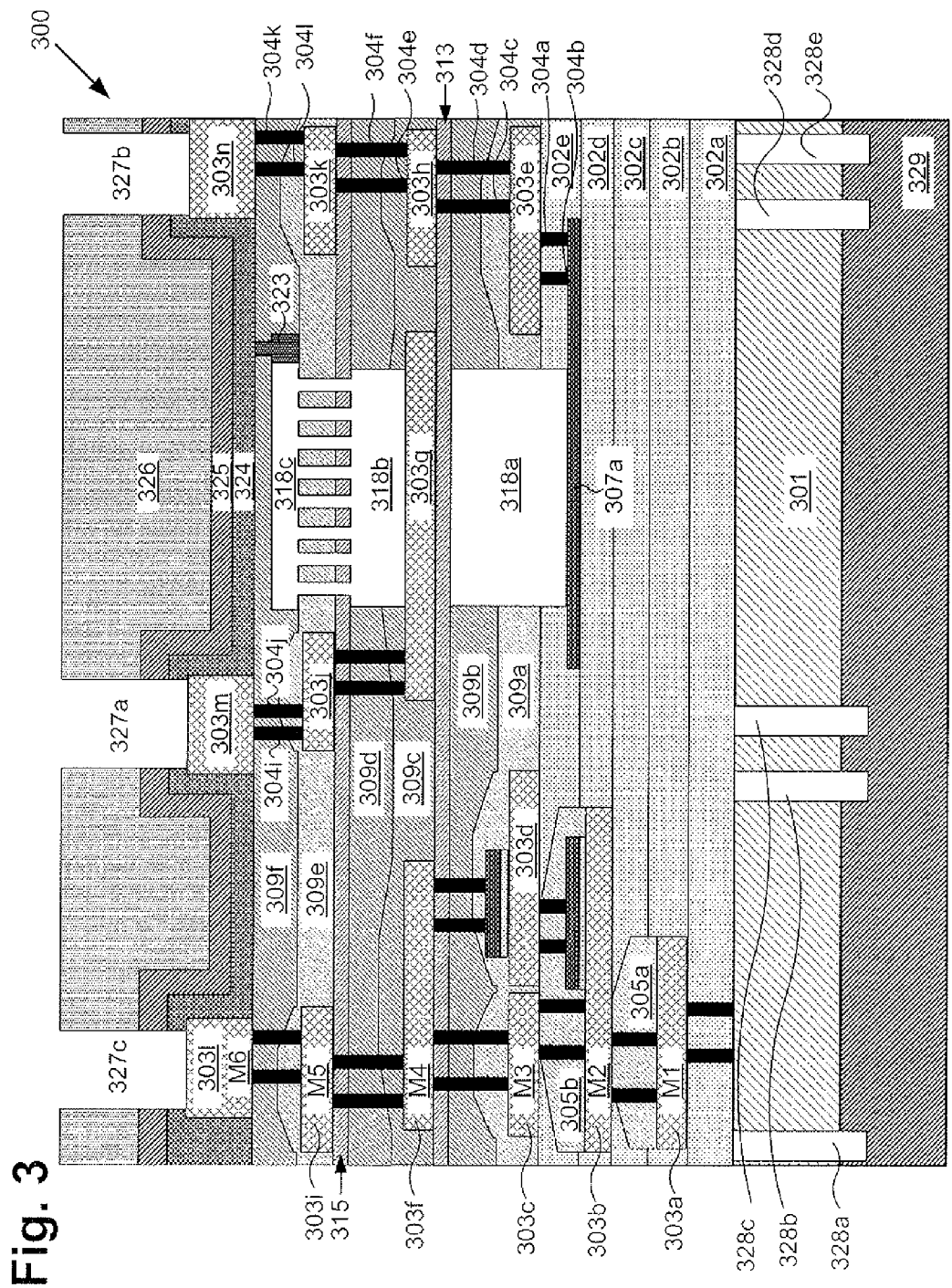
FIG. 3 illustrates a cross-sectional view of a portion of the wafer processed according to one implementation of the present application.

FIG. 3 illustrates a cross-sectional view of a portion of the wafer according to an implementation of the present application. In FIG. 3, similar numerals may refer to similar features in structure 293 of FIG. 2N. Structure 300 includes photoresist layer 326, openings 327*a*, 327*b* and 327*c*, deep trenches 328*a*, 328*b*, 328*c*, 328*d* and 328*e*, and layer 329. Photoresist layer 326 is formed over passivation layers 324 and 325. As shown in FIG. 3, openings 327*a*, 327*b* and 327*c* are formed by, for example, etching through photoresist layer 326, passivation layers 324 and 325, to expose a top surface of metal segments 303*m* and 303*n*, respectively, for external electrical connection. In addition, deep trenches 328*a*, 328*b*, 328*c*, 328*d* and 328*e* may be optionally formed in semiconductor substrate 301 and layer 329, where layer 329 may be a buried oxide layer or a high resistivity layer. Deep trenches 328*a*, 328*b*, 328*c*, 328*d* and 328*e* may be used to isolate the area under the MEMS device from other semiconductor devices formed in structure 300.

As further shown in FIG. 3, the MEMS device may include bottom MEMS plate 307*a*, top MEMS plate 303*g*, lower chamber 318*a*, upper chamber 318*b*, first sealing layer 309*e*, release chamber 318*c* and second sealing layer 309*f*, where lower chamber 318*a*, upper chamber 318*b* and release chamber 318*c* are sealed to by second plurality of overlying plugs, such as overlying plug 323, to have substantially the same or similar pressure and substantially the same or similar gaseous chemistry. The MEMS device may be implemented as a resonator, a capacitor or a switch. For example, when a voltage or current is supplied between metal segments 303*m* and 303*n* in structure 300, an electrostatic attractive force between bottom MEMS plate 307*a* and top MEMS plate 303*g* can be generated to attract and release top MEMS plate 303*g*, while bottom MEMS plate 307*a* is a fixed at the bottom of lower chamber 318*a*.

Figure 4A:
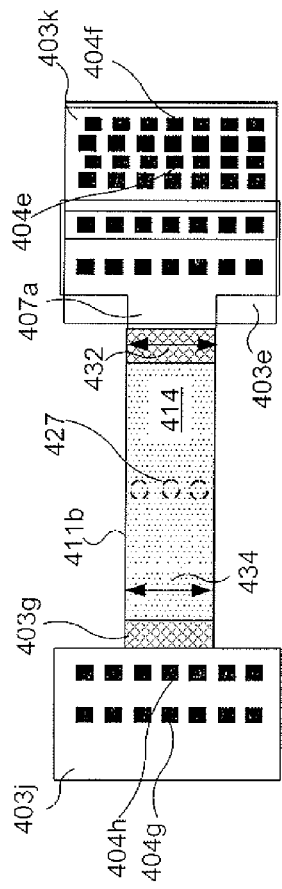
FIG. 4A illustrates a top view of a portion of the wafer processed according to an alternative implementation of the present application.
Figure 4B:
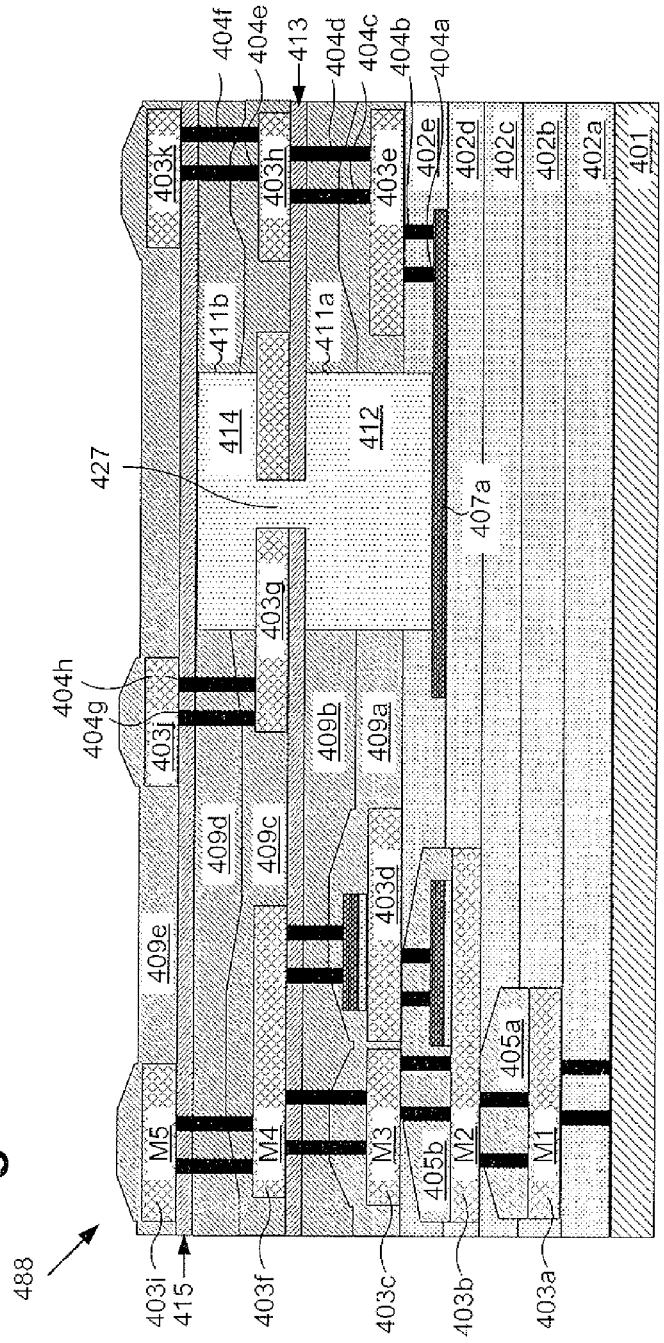
FIG. 4B illustrates a cross-sectional view of a portion of the wafer processed according to an alternative implementation of the present application.

Referring to FIGS. 4A and 4B, FIGS. 4A and 4B schematically show a variation of the implementation shown in FIGS. 2I-i though 2I-ii, where sacrificial materials 412 and 414 may be connected by one or more through-holes 427 in the center of top MEMS plate 403*g*. As shown in FIG. 4A, width 432 of top MEMS plate 403*g* is substantially the same as width 434 of opening 411*b*. In another implementation, width 432 of top MEMS plate 403*g* can be less than width 434 of opening 411*b*, such that sacrificial materials 412 and 414 can be in contact with each other in regions beyond width 432 of top MEMS plate 403*g* (e.g., similar to regions 217*a* and 217*b* in FIG. 2I-i), and in one or more through-holes 427. In other implementations, the connection between sacrificial materials 412 and 414 can be made at various locations within and/or beyond the interior of top MEMS plate 403*g*. The particular location may depend on the geometry, length, and scale of various MEMS devices.

Figure 5A:
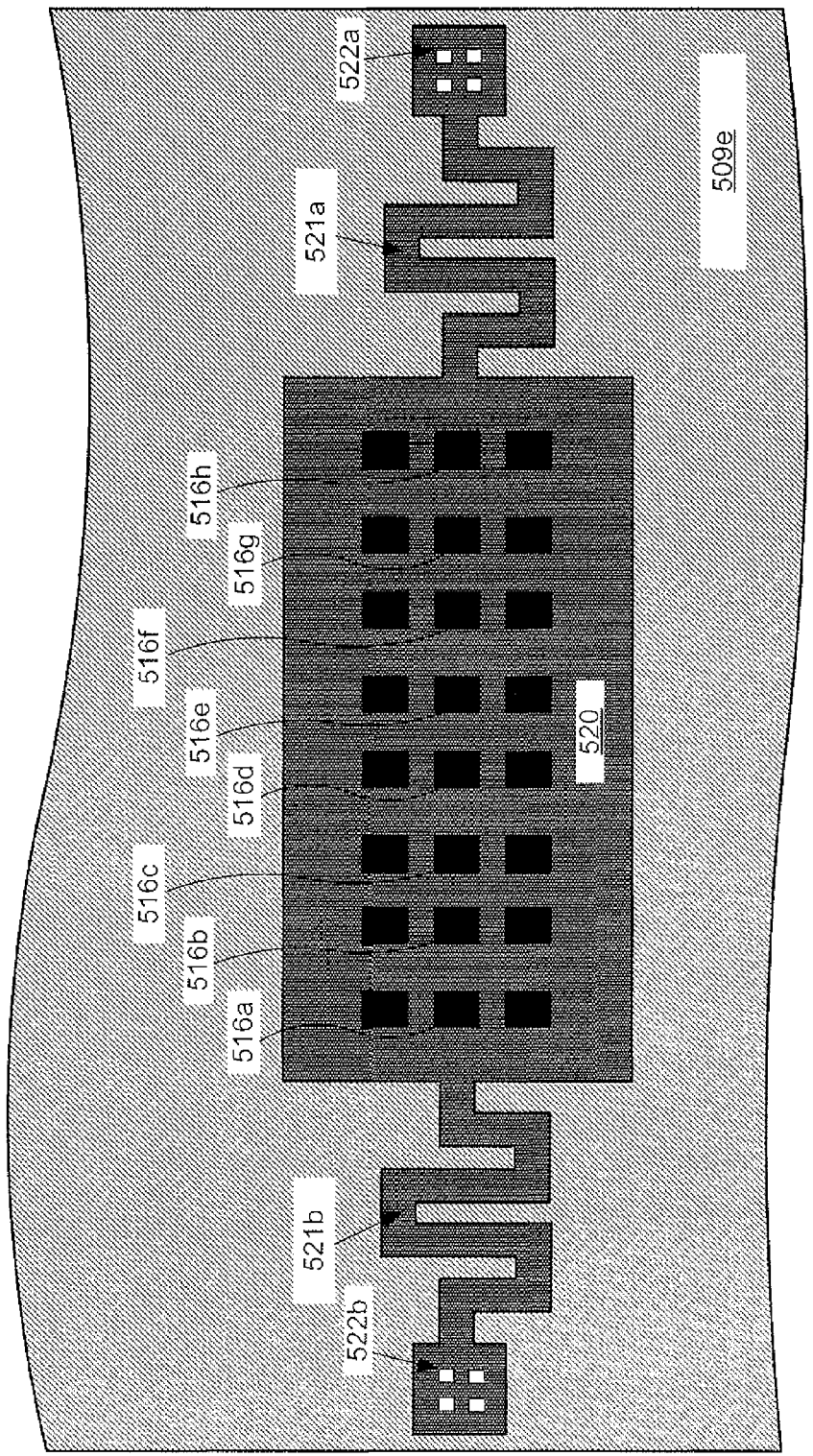
FIG. 5A illustrates a top view of a portion of the wafer processed according to an alternative implementation of the present application.

Referring to FIG. 5A, FIG. 5A schematically shows a variation of the implementation shown in FIGS. 2L-i and 2L-ii, where second plurality of release holes, such as release holes 522*a* and 522*b*, are formed away from sacrificial capping layer 520, which may correspond to sacrificial capping layer 220 in FIG. 2L-i, and are respectively connected to sacrificial capping layer 520 by circuitous paths 521*a* and 521*b*.

As shown in FIG. 5A, in the present implementation, the dimensions of second plurality of release holes, such as release holes 522*a* and 522*b* are smaller than those of first plurality of release holes 516*a* through 516*h*, which are filled with sacrificial overlying plugs of sacrificial capping layer 520 in FIG. 5A. In another implementation, second plurality of release holes, such as release holes 522*a* and 522*b*, may have the same or larger dimensions than those of first plurality of release holes 516*a* through 516*h* to allow a faster release. Removing sacrificial capping layer 520 through second plurality of release holes, such as release holes 522*a* and 522*b*, and through circuitous paths 521*a* and 521*b*, allows better control of the removal process while substantially eliminating damage to the chambers, especially release chamber 518*c* shown in FIG. 5B. In addition, by the configuring the length and shape of circuitous paths 521*a* and 521*b*, the speed of the second release can be well controlled. In one implementation, sacrificial capping layer 520 and circuitous paths 521*a* and 521*b* may be formed of the same material. In one implementation, circuitous paths 521*a* and 521*b* may be formed of different materials. In one implementation, circuitous paths 521*a* and 521*b* may have path shapes and lengths different than the ones shown in FIG. 5A.

Figure 5B:
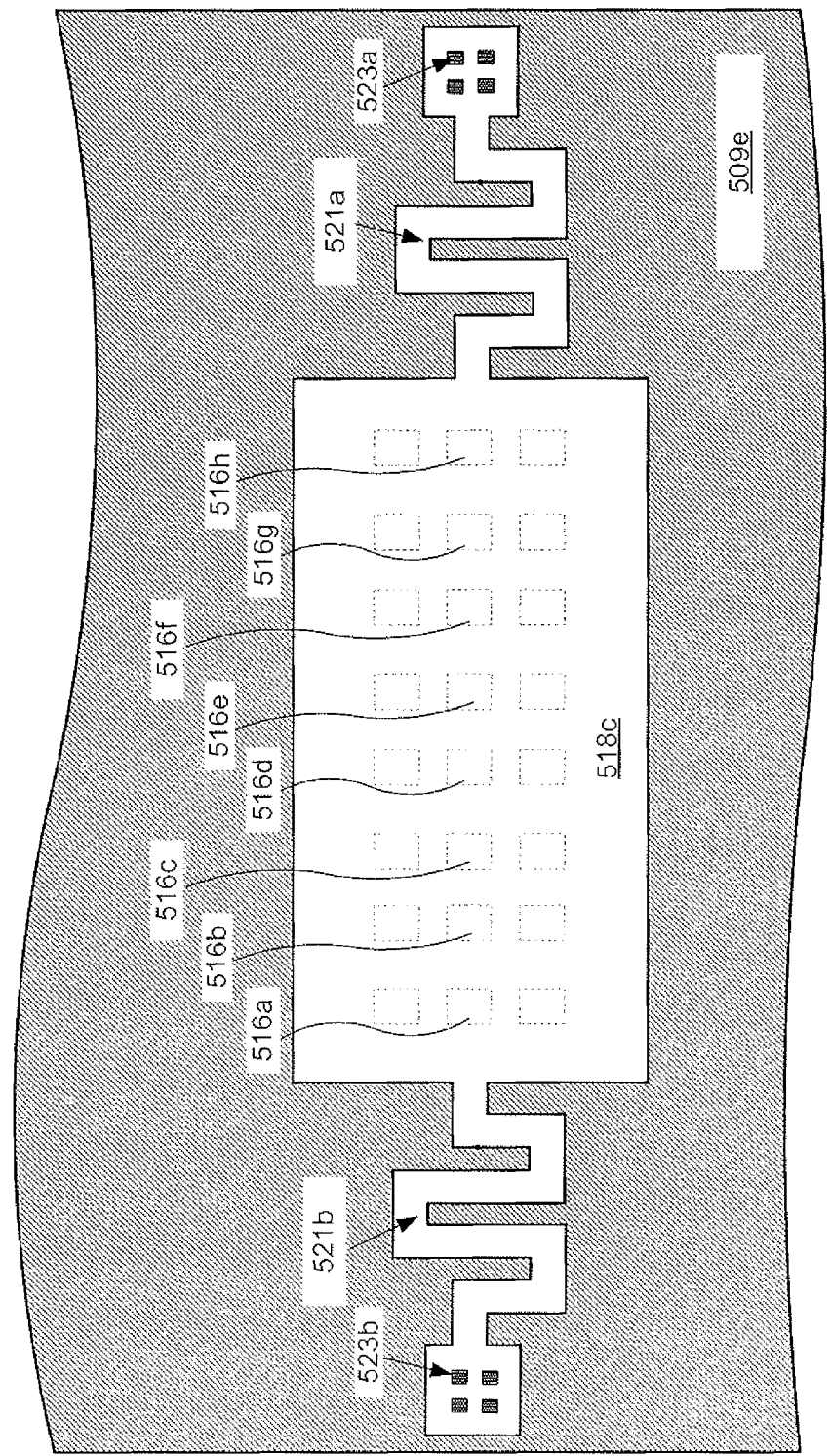
FIG. 5B illustrates a top view of a portion of the wafer processed according to an alternative implementation of the present application.

Referring to FIG. 5B, FIG. 5B schematically shows a variation of the implementation shown in FIGS. 2M-i through 2N, where sacrificial capping layer 520, which may correspond to sacrificial capping layer 220 in FIG. 2L-i, is removed through circuitous paths 521*a* and 521*b* and second plurality of release holes, such as release holes 522*a* and 522*b*, respectively, and where second plurality of release holes, such as release holes 522*a* and 522*b*, are plugged by second plurality of overlying plugs, such as overlying plugs 523*a* and 523*b*.

As shown in FIG. 5B, the second release removes sacrificial capping layer 520 including first plurality of overlying plugs, (e.g., sacrificial overlying plugs 219*a* through 219*h* in FIG. 2L-ii) and the sacrificial materials in circuitous paths 521*a* and 521*b*, and forms release chamber 518*c*, which may correspond to release chamber 218*c* in FIG. 2N. Thereafter, second plurality of release holes, such as release holes 522*a* and 522*b*, are plugged and sealed by second plurality of overlying plugs, such as overlying plugs 523*a* and 523*b*, respectively. As such, the second release removes any and all undesirable gaseous content and/or contaminants from lower chamber 218*a* and upper chamber 218*b*, and allows the lower, upper and release chambers to be re-sealed under a second controlled environment, for example.

The present inventive concepts utilize a double release process to control the environment inside a MEMS device, where a first release simultaneously removes sacrificial materials in lower and upper chambers to allow a sacrificial capping layer to seal the lower and upper chambers with a first controlled environment, and where a second release removes the sacrificial capping layer, thereby creating a release chamber of the MEMS device, to allow a second sealing layer and a second plurality of overlying plugs to seal the lower, upper and release chambers of the MEMS device with a second controlled environment. The environment within the lower, upper and release chambers of the MEMS device may be controlled and/or determined by the deposition conditions prior to or during the formation of the sacrificial capping layer having the first plurality of overlying plugs, and the second plurality of overlying plugs. The sealed lower and upper chambers after the first release process may have a first controlled environment of substantially the same or similar gaseous chemistry at substantially the same or similar pressure. The sealed lower, upper, and release chambers after the second release process may have a second controlled environment of substantially the same or similar gaseous chemistry at substantially the same or similar pressure.

In one implementation of the present application, the second plurality of release holes for the second release process are located away from the lower, upper and release chambers, and are connected to the release chamber through one or more circuitous paths. In one implementation of the present application, since the sacrificial materials in the lower and upper chambers of the MEMS device have already been released in the first release process, the second release process, which removes the sacrificial capping layer, may take substantially less time, and may result in a significantly cleaner environment in the lower, upper, and release chambers of the MEMS device, as compared to releasing the sacrificial materials in the lower, upper and release chambers together.

In one implementation of the present application, a method of fabricating and sealing a MEMS device can be conducted independently of the sacrificial materials used in the MEMS device and its method of removal. As such, the sealing of the lower, upper and release chambers of the MEMS device may be performed in the same process tool as the one used to perform the removal of the sacrificial materials in the chambers, thereby enabling low cost and rapid implementation of MEMS fabrication. In one implementation of the present application, at least one MEMS device manufactured in accordance with a method disclosed in the present application is integrated and/or embedded within a semiconductor wafer, such as an radio frequency (RF) complementary metal-oxide-semiconductor (CMOS) wafer.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A MEMS device comprising:
a top MEMS plate and a bottom MEMS plate;
a lower chamber between said bottom MEMS plate and said top MEMS plate, and an upper chamber between said top MEMS plate and a first sealing layer;
a release chamber between said top MEMS plate and a second sealing layer, said release chamber allowing gaseous content of said upper chamber to be released.

2. The MEMS device of claim 1, wherein said top MEMS plate has at least one segment that is narrower than said bottom MEMS plate.

3. The MEMS device of claim 1 wherein said release chamber allows gaseous content of said bottom chamber to be released.

4. The MEMS device of claim 1, wherein said first sealing layer comprises a first plurality of release holes.

5. The MEMS device of claim 1, wherein said second sealing layer comprises a second plurality of release holes located away from said lower and upper chambers.

6. The MEMS device of claim 5, wherein overlying plugs fill said second plurality of release holes in said second sealing layer.

7. The MEMS device of claim 1, wherein said second sealing layer comprises a second plurality of release holes in connection with said release chamber through at least one circuitous path in said second sealing layer.

8. The MEMS device of claim 1, further comprising a MEMS dielectric layer between said top MEMS plate and said bottom MEMS plate.

9. The MEMS device of claim 1, wherein said top MEMS plate comprises at least one through-hole.

10. The MEMS device of claim 1, wherein said lower, upper and release chambers have a similar pressure.

11. The MEMS device of claim 1, wherein said lower, upper and release chambers have a similar gaseous chemistry.

12. A method of forming a MEMS device, said method comprising:
forming a bottom MEMS plate;
forming a top MEMS plate over said bottom MEMS plate;
forming a first sealing layer over said top MEMS plate;
performing a first release to remove sacrificial material situated under and over said top MEMS plate through a first plurality of release holes in said first sealing layer, thereby forming an upper chamber between said first sealing layer and said top MEMS plate, and a lower chamber between said top MEMS plate and said bottom MEMS plate;
forming a sacrificial capping layer over said first sealing layer;
forming a second sealing layer over said sacrificial capping layer;
performing a second release to remove said sacrificial capping layer through a second plurality of release holes in said second sealing layer, thereby forming a release chamber between said second sealing layer and said first sealing layer;
plugging said second plurality of release holes.

13. The method of claim 12, wherein said top MEMS plate has at least one segment that is narrower than said bottom MEMS plate.

14. The method of claim 12, wherein said top MEMS plate includes at least one through-hole.

15. The method of claim 12, wherein said sacrificial capping layer comprises a material selected from the group consisting of a polymer, a dielectric and a metal.

16. The method of claim 12, wherein said second plurality of release holes are in connection with said release chamber through at least one circuitous path in said second sealing layer.

17. The method of claim 12, further comprising forming a MEMS dielectric layer between said top MEMS plate and said bottom MEMS plate.

18. The method of claim 12, wherein said lower, upper and release chambers have a similar gaseous chemistry.

19. The method of claim 12, wherein said lower, upper and release chambers have a similar pressure.

20. The method of claim 12, wherein said second plurality of release holes are located away from said lower and upper chambers.

* * * * *